United States Patent
Papandreou et al.

(10) Patent No.: US 11,094,383 B2
(45) Date of Patent: Aug. 17, 2021

(54) SELECTIVE PAGE CALIBRATION BASED ON HIERARCHICAL PAGE MAPPING

(71) Applicant: International Business Machines Corporation, Armonk, NY (US)

(72) Inventors: Nikolaos Papandreou, Thalwil (CH); Sasa Tomic, Kilchberg (CH); Roman A. Pletka, Uster (CH); Nikolas Ioannou, Zurich (CH); Charalampos Pozidis, Thalwil (CH); Aaron D. Fry, Richmond, TX (US); Timothy J. Fisher, Cypress, TX (US)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 16/112,392

(22) Filed: Aug. 24, 2018

(65) Prior Publication Data
US 2020/0066355 A1 Feb. 27, 2020

(51) Int. Cl.
*G11C 16/26* (2006.01)
*G06F 11/07* (2006.01)
(Continued)

(52) U.S. Cl.
CPC ............ *G11C 16/26* (2013.01); *G06F 11/073* (2013.01); *G06F 11/076* (2013.01);
(Continued)

(58) Field of Classification Search
CPC . G11C 16/26; G11C 16/0483; G11C 16/3427; G11C 16/3495; G06F 11/073; G06F 11/076; G06F 11/0793
See application file for complete search history.

(56) References Cited

U.S. PATENT DOCUMENTS

| | | | |
|---|---|---|---|
| 7,012,835 B2* | 3/2006 | Gonzalez | G06F 11/106 365/185.09 |
| 7,477,547 B2* | 1/2009 | Lin | G06F 11/106 365/185.09 |

(Continued)

FOREIGN PATENT DOCUMENTS

WO  2018022662 A1  2/2018

OTHER PUBLICATIONS

Camp et al., U.S. Appl. No. 14/500,900, filed Sep. 29, 2014.
(Continued)

*Primary Examiner* — Vanthu T Nguyen
(74) *Attorney, Agent, or Firm* — Zilka-Kotab, P.C.

(57) ABSTRACT

A computer-implemented method, according to one embodiment, includes: detecting that a calibration of a first page group has been triggered, and evaluating a hierarchical page mapping to determine whether the first page group correlates to one or more other page groups in non-volatile memory. In response to determining that the first page group does correlate to one or more other page groups in the non-volatile memory, a determination is made as to whether to promote at least one of the one or more other page groups for calibration. In response to determining to promote at least one of the one or more other page groups for calibration, the first page group and the at least one of the one or more other page groups are calibrated. Moreover, each of the page groups includes one or more pages in non-volatile memory.

20 Claims, 13 Drawing Sheets

(51) Int. Cl.
*G11C 16/04* (2006.01)
*G11C 16/34* (2006.01)

(52) U.S. Cl.
CPC ...... *G06F 11/0793* (2013.01); *G11C 16/0483* (2013.01); *G11C 16/3427* (2013.01); *G11C 16/3495* (2013.01)

(56) References Cited

U.S. PATENT DOCUMENTS

| | | |
|---|---|---|
| 9,171,620 B2 * | 10/2015 | Avila ................... G11C 16/04 |
| 9,251,909 B1 | 2/2016 | Camp et al. |
| 9,583,205 B2 | 2/2017 | Camp et al. |
| 9,727,413 B2 * | 8/2017 | Cordero ............... G06F 11/106 |
| 9,864,523 B2 | 1/2018 | Camp et al. |
| 2016/0110248 A1 | 4/2016 | Camp et al. |
| 2016/0141048 A1 | 5/2016 | Camp et al. |
| 2017/0123660 A1 | 5/2017 | Camp et al. |
| 2018/0059940 A1 | 3/2018 | Camp et al. |
| 2018/0059941 A1 | 3/2018 | Camp et al. |

OTHER PUBLICATIONS

Camp et al., U.S. Appl. No. 14/987,724, filed Jan. 4, 2016.
Camp et al., U.S. Appl. No. 15/405,162, filed Jan. 12, 2017.
Camp et al., U.S. Appl. No. 15/804,933, filed Nov. 6, 2017.
Camp et al., U.S. Appl. No. 15/804,975, filed Nov. 6, 2017.
U.S. Appl. No. 16/109,689, filed Aug. 22, 2018.
U.S. Appl. No. 16/014,909, filed Jun. 21, 2018.

* cited by examiner

SELECTIVE PAGE CALIBRATION BASED ON HIERARCHICAL PAGE MAPPING

BACKGROUND

The present invention relates to non-volatile memory such as NAND Flash memory, and more particularly, this invention relates to selectively calibrating pages in non-volatile memory based on hierarchical page mapping.

Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

The raw bit error rate (RBER) of a Flash memory block will typically increase over time due to additional program and erase cycling, charge leakage from retention, and additional charge placed in the cells by read operations (i.e., read disturb errors). Typically, a Flash memory block is retired when any page in the block exhibits a code word that reaches a page retirement error count limit. This limit is typically set to be achieved in conjunction with an appropriate error correction code (ECC), with the RBER for a Flash memory block being set to be similar to the RBER in traditional hard disk drives, e.g., at around $10^{-15}$, but may be more or less.

Read voltage shifting, also known as block calibration, has been shown to be a key contributor to enhance endurance and retention, particularly for enterprise-level Flash memory systems using modern three-dimensional (3-D) triple-level-cell (TLC) or quad-level-cell (QLC) NAND Flash memory. Previous attempts to maintain efficient memory performance typically included inspecting the read voltages for each block of memory in a sweeping fashion or by a read voltage shifting algorithm that tracks and corrects the read voltages depending on how the threshold voltage distributions have changed as a result of cycling or retention or other disturbing effects. Moreover, upon identifying a block which was a calibration candidate, these previous attempts would perform block-level calibrations in which all pages in the identified block would be calibrated. It follows that these previous attempts involved inspecting each block in memory individually. Furthermore, although a block of memory is identified as being a candidate for calibration, typically not all pages in the block benefit from the calibration.

SUMMARY

A computer-implemented method, according to one embodiment, includes: detecting that a calibration of a first page group has been triggered, and evaluating a hierarchical page mapping to determine whether the first page group correlates to one or more other page groups in non-volatile memory. In response to determining that the first page group does correlate to one or more other page groups in the non-volatile memory, a determination is made as to whether to promote at least one of the one or more other page groups for calibration. In response to determining to promote at least one of the one or more other page groups for calibration, the first page group and the at least one of the one or more other page groups are calibrated. Moreover, each of the page groups includes one or more pages in non-volatile memory.

A computer-implemented method, according to another embodiment, includes: detecting that a bit error count of a first page group has triggered a calibration of the first page group, and calibrating the first page group. A determination is made as to whether an updated bit error count of the calibrated first page group is above a threshold. In response to determining that the updated bit error count of the calibrated first page group is above the threshold, a hierarchical page mapping is evaluated to determine whether the first page group correlates to one or more other page groups in non-volatile memory. In response to determining that the first page group does correlate to one or more other page groups in the non-volatile memory, at least one of the one or more other page groups is calibrated. Moreover, each of the page groups includes one or more pages in non-volatile memory.

A computer program product, according to yet another embodiment, includes a computer readable storage medium having program instructions embodied therewith. The computer readable storage medium is not a transitory signal per se. Moreover, the program instructions readable and/or executable by a processor to cause the processor to perform a method which includes: detecting, by the processor, that a calibration of a first page group has been triggered; and evaluating, by the processor, a hierarchical page mapping to determine whether the first page group correlates to one or more other page groups in non-volatile memory. In response to determining that the first page group does correlate to one or more other page groups in the non-volatile memory, a determination is made, by the processor, as to whether to promote at least one of the one or more other page groups for calibration. In response to determining to promote at least one of the one or more other page groups for calibration, the first page group and the at least one of the one or more other page groups are calibrated by the processor. Moreover, each of the page groups includes one or more pages in non-volatile memory.

Other aspects and embodiments of the present invention will become apparent from the following detailed description, which, when taken in conjunction with the drawings, illustrate by way of example the principles of the invention.

DETAILED DESCRIPTION

Figure 1:
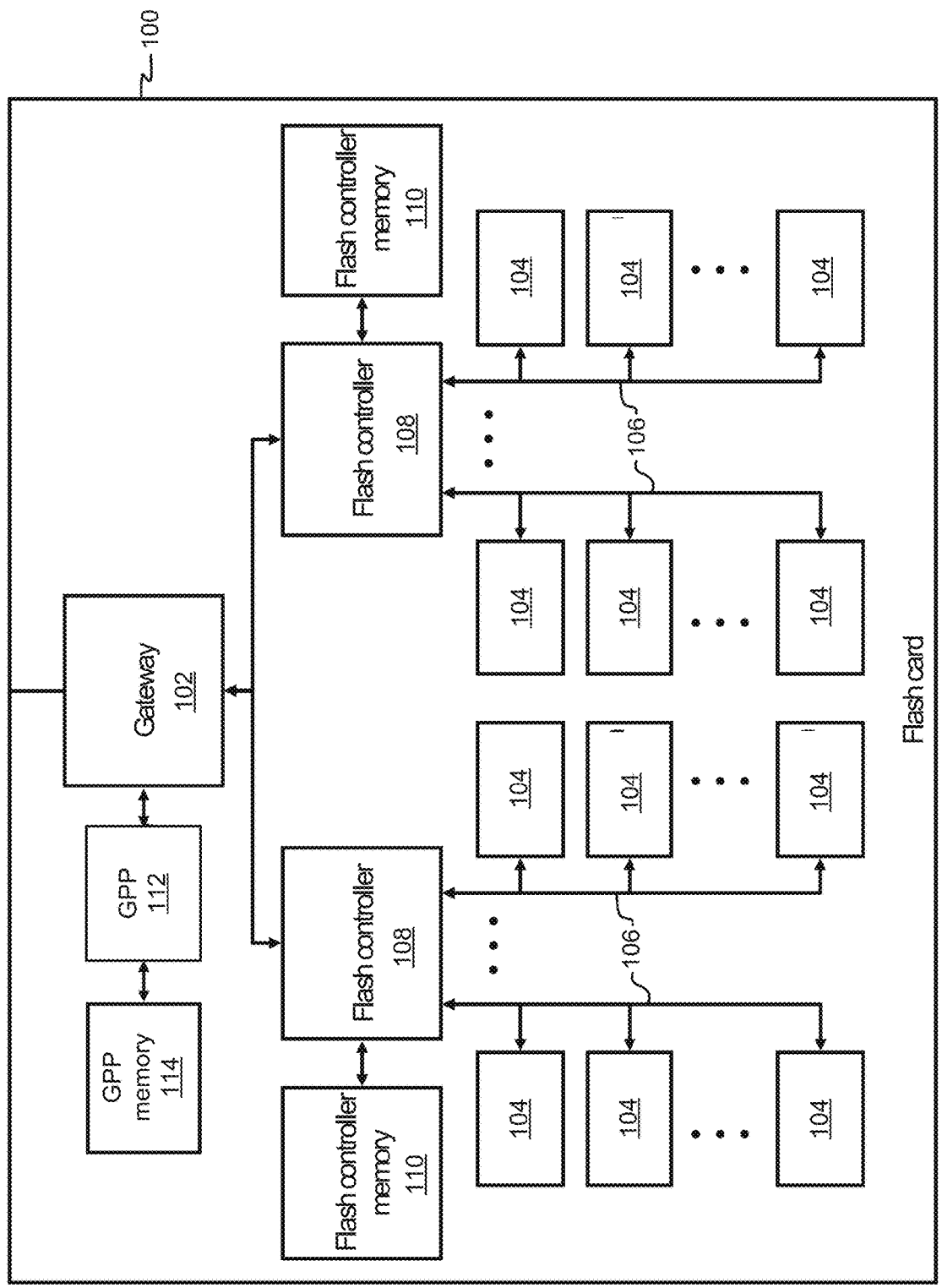
FIG. 1 is a diagram of a non-volatile memory card, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of data storage systems, as well as operation and/or component parts thereof. It should be appreciated that various embodiments herein can be implemented with a wide range of memory mediums, including for example non-volatile random access memory (NVRAM) technologies such as NAND Flash memory, NOR Flash memory, phase-change memory (PCM), magnetoresistive RAM (MRAM) and resistive RAM (RRAM). To provide a context, and solely to assist the reader, various embodiments may be described with reference to a type of non-volatile memory. This has been done by way of example only, and should not be deemed limiting on the invention defined in the claims.

In one general embodiment, a computer-implemented method includes: detecting that a calibration of a first page group has been triggered, and evaluating a hierarchical page mapping to determine whether the first page group correlates to one or more other page groups in non-volatile memory. In response to determining that the first page group does correlate to one or more other page groups in the non-volatile memory, a determination is made as to whether to promote at least one of the one or more other page groups for calibration. In response to determining to promote at least one of the one or more other page groups for calibration, the first page group and the at least one of the one or more other page groups are calibrated. Moreover, each of the page groups includes one or more pages in non-volatile memory.

In another general embodiment, a computer-implemented method includes: detecting that a bit error count of a first page group has triggered a calibration of the first page group, and calibrating the first page group. A determination is made as to whether an updated bit error count of the calibrated first page group is above a threshold. In response to determining that the updated bit error count of the calibrated first page group is above the threshold, a hierarchical page mapping is evaluated to determine whether the first page group correlates to one or more other page groups in non-volatile memory. In response to determining that the first page group does correlate to one or more other page groups in the non-volatile memory, at least one of the one or more other page groups is calibrated. Moreover, each of the page groups includes one or more pages in non-volatile memory.

In yet another general embodiment, a computer program product includes a computer readable storage medium having program instructions embodied therewith. The computer readable storage medium is not a transitory signal per se. Moreover, the program instructions readable and/or executable by a processor to cause the processor to perform a method which includes: detecting, by the processor, that a calibration of a first page group has been triggered; and evaluating, by the processor, a hierarchical page mapping to determine whether the first page group correlates to one or more other page groups in non-volatile memory. In response to determining that the first page group does correlate to one or more other page groups in the non-volatile memory, a determination is made, by the processor, as to whether to promote at least one of the one or more other page groups for calibration. In response to determining to promote at least one of the one or more other page groups for calibration, the first page group and the at least one of the one or more other page groups are calibrated by the processor. Moreover, each of the page groups includes one or more pages in non-volatile memory.

FIG. 1 illustrates a memory card 100, in accordance with one embodiment. It should be noted that although memory card 100 is depicted as an exemplary non-volatile data storage card in the present embodiment, various other types of non-volatile data storage cards may be used in a data storage system according to alternate embodiments. It follows that the architecture and/or components of memory card 100 are in no way intended to limit the invention, but rather have been presented as a non-limiting example.

Moreover, as an option, the present memory card 100 may be implemented in conjunction with features from any other embodiment listed herein, such as those described with reference to the other FIGS. However, such memory card 100 and others presented herein may be used in various applications and/or in permutations which may or may not be specifically described in the illustrative embodiments listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed DRAM, phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various embodiments, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various embodiments.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various embodiments described herein. However, depending on the desired embodiment, the controller memory 110 may be battery-backed DRAM, phase-change memory PC-RAM, MRAM, STT-MRAM, etc., or a combination thereof.

Figure 2:
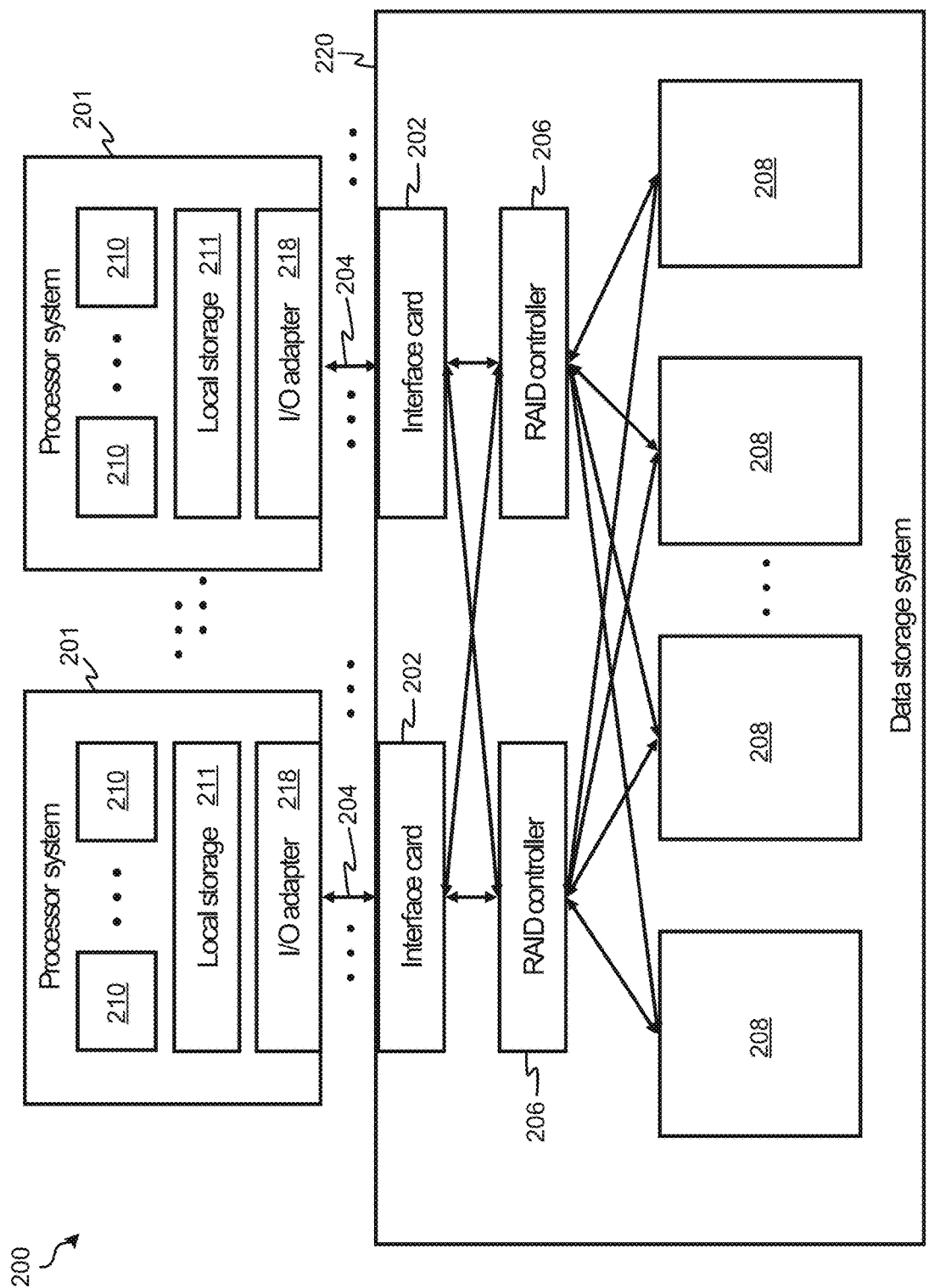
FIG. 2 is a diagram of a data storage system architecture, in accordance with one embodiment.

As previously mentioned, memory card 100 may be implemented in various types of data storage systems, depending on the desired embodiment. FIG. 2 illustrates a data storage system architecture 200 according to an exemplary embodiment which is in no way intended to limit the invention. Moreover, it should be noted that the data storage system 220 of FIG. 2 may include various components found in the embodiment of FIG. 1.

Looking to FIG. 2, the data storage system 220 comprises a number of interface cards 202 configured to communicate via I/O interconnections 204 to one or more processor systems 201. The data storage system 220 may also comprise one or more RAID controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 1114 of FIG. 11, ROM 1116 of FIG. 11, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired embodiment. Specifically, memory controllers may include logic configured to perform any one or more of the following functions, which are in no way intended to be an exclusive list. In other words, depending on the desired embodiment, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, LEBs may be identified for being reclaimed and/or relocated. Typically, one LEB corresponds to one block stripe, but alternative implementations may consider a fixed number of block stripes building a LEB as well.

A physical "block" represents a minimal unit that may be erased on non-volatile memory, e.g., such as NAND Flash memory, and thereby prepared for writing data thereto. However, a typical garbage collection unit of operation is often a multiple of the physical blocks of non-volatile memory, and is also referred to herein as a LEB. This is due to the fact that typically RAID-like parity information is added in LEBs. Therefore, in case of a page or block failure data can only be rebuilt when all blocks in the LEB are still holding data. Accordingly, the individual blocks from the garbage collection unit can only be erased either individually or in a single unit once all still valid data from all blocks in the LEB has been relocated successfully to new locations. Hence, the full garbage collection units are garbage-collected as a single unit. Moreover, the size of the LEB directly affects the garbage collection induced write amplification. The larger the LEB, the more likely it becomes that unrelated data are stored together in the LEB, and therefore more of the LEB data may have to be relocated upon garbage collection selection.

Frequently, blocks from different dies and/or flash channels are grouped together, such that blocks from the same group can be read or written in parallel, thereby increasing overall bandwidth. It is also possible to combine the previous two methods, and to compose RAID stripes using blocks from different flash channels that can be accessed in parallel.

It should also be noted that an LEB may include any multiple of the physical memory block, which is a unit of physical erasure. Moreover, the organization of memory blocks into LEBs not only allows for adding RAID-like parity protection schemes among memory blocks from different memory chips, memory planes and/or channels but also allows for significantly enhancing performance through higher parallelism. For instance, multiple non-volatile memory blocks may be grouped together in a RAID stripe. As will be appreciated by one skilled in the art upon reading the present description, RAID schemes generally improve reliability and reduce the probability of data loss.

According to an exemplary embodiment, which is in no way intended to limit the invention, memory controllers (e.g., see 108 of FIG. 1) may internally perform a garbage collection. As previously mentioned, the garbage collection may include selecting a LEB to be relocated, after which all data that is still valid on the selected LEB may be relocated (e.g., moved). After the still valid data has been relocated, the LEB may be erased and thereafter, used for storing new data. The amount of data relocated from the garbage collected LEB determines the write amplification. Moreover, an efficient way to reduce the write amplification includes implementing heat segregation.

Heat Segregation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the LPT mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat segregation when determining the heat of the memory block for some embodiments. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, heat segregation may be achieved. In particular, heat segregating methods may group hot memory pages together in certain memory blocks while cold memory pages are grouped together in separate memory blocks. Thus, a heat segregated LEB tends to be occupied by either hot or cold data.

The merit of heat segregation is two-fold. First, performing a garbage collection process on a hot memory block will prevent triggering the relocation of cold data as well. In the absence of heat segregation, updates to hot data, which are performed frequently, also results in the undesirable relocations of all cold data collocated on the same LEB as the hot data being relocated. Therefore, the write amplification incurred by performing garbage collection is much lower for embodiments implementing heat segregation.

Secondly, the relative heat of data can be utilized for wear leveling purposes. For example, hot data may be placed in healthier (e.g., younger) memory blocks, while cold data may be placed on less healthy (e.g., older) memory blocks relative to those healthier memory blocks. Thus, the rate at which relatively older blocks are exposed to wear is effectively slowed, thereby improving the overall endurance of a given data storage system implementing heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired embodiment, logic of a storage system may be configured to perform additional or alternative functions, as would be appreciated by one skilled in the art upon reading the present description.

Figure 3:
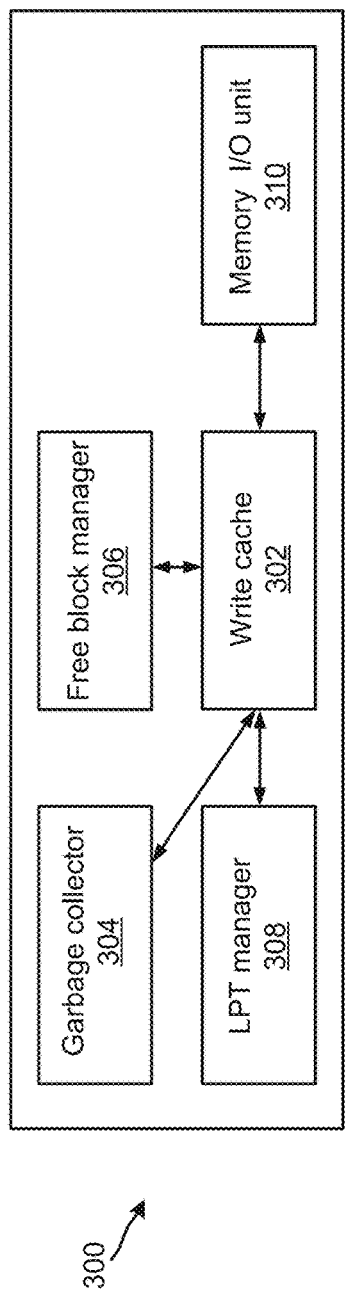
FIG. 3 is a system diagram, in accordance with one embodiment.

Referring now to FIG. 3, a system 300 is illustrated in accordance with one embodiment. As an option, the present system 300 may be implemented in conjunction with features from any other embodiment listed herein, such as those described with reference to the other FIGS. However, such system 300 and others presented herein may be used in various applications and/or in permutations which may or may not be specifically described in the illustrative embodiments listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus, the garbage collector 304 may reclaim blocks of consecutive physical space, depending on the desired embodiment. According to an exemplary embodiment, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages in memory. According to an example, which is in no way intended to limit the invention, the LPT manager 308 may maintain the logical-to-physical mappings of 4 KiB logical addresses. The memory I/O unit 310 communicates with the memory chips in order to perform low level operations, e.g., such as reading one or more non-volatile memory pages, writing a non-volatile memory page, erasing a non-volatile memory block, etc.

Figure 4A:
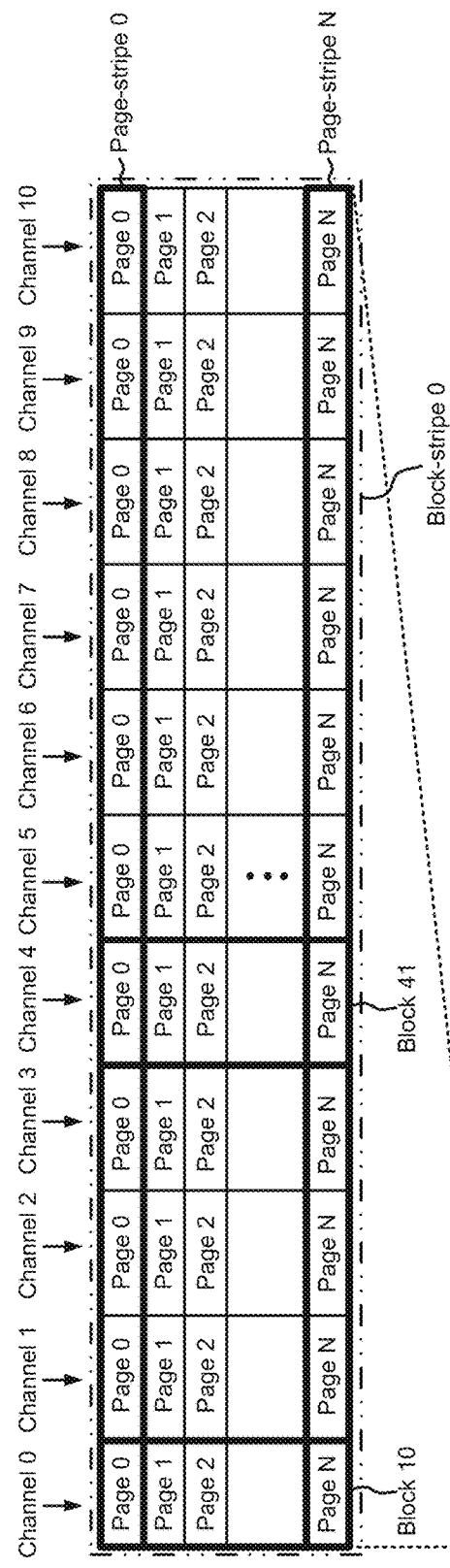
FIG. 4A is a conceptual diagram which includes a block-stripe and page-stripe, in accordance with one embodiment.

To better understand the distinction between block-stripes and page-stripes as used herein, FIG. 4A is a conceptual diagram 400, in accordance with one embodiment. LEBs are built from block stripes and typically a single block stripe is used to build a LEB. However, alternative embodiments may use multiple block stripes to form an LEB. As an option, the present conceptual diagram 400 may be implemented in conjunction with features from any other embodiment listed herein, such as those described with reference to the other FIGS. However, such conceptual diagram 400 and others presented herein may be used in various applications and/or in permutations which may or may not be specifically described in the illustrative embodiments listed herein. Further, the controller conceptual diagram 400 presented herein may be used in any desired environment. Thus, the exemplary non-volatile memory controller conceptual diagram 400 of FIG. 4A may be implemented in a cache architecture. However, depending on the desired embodiment, the conceptual diagram 400 of FIG. 4A may be implemented in defining the organization of data stored in non-volatile memory. Accordingly, both implementations are described in turn below.

Non-Volatile Memory

Looking now to FIG. 4A, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel forms a respective block-stripe. It follows that a number of block-stripes supported by a given embodiment of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4A, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4A, the multiple blocks of aggregated Plane 0 constitute Block-stripe 0. While all blocks in a block-stripe typically belong to the same aggregated plane, in some embodiments one or more blocks of a block-stripe may belong to different physical planes. It follows that each aggregated plane may include one or more block-stripe. Thus, according to an illustrative embodiment, Block 0 through Block 10 from different physical planes may constitute a block-stripe.

Regardless of whether the conceptual diagram 400 of FIG. 4A is implemented with non-volatile memory and/or a cache architecture, in different embodiments, the number of pages in each block and/or the number of channels in each plane may vary depending on the desired embodiment. According to an exemplary embodiment, which is in no way intended to limit the invention, a block may include 1024 pages, but could include more or less in various embodiments. Analogously, the number of channels per plane and/or the number of planes may vary depending on the desired embodiment.

Referring still to FIG. 4A, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

Figure 4A:
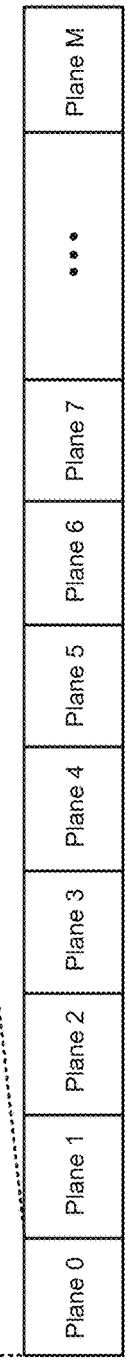
Figure 4B:
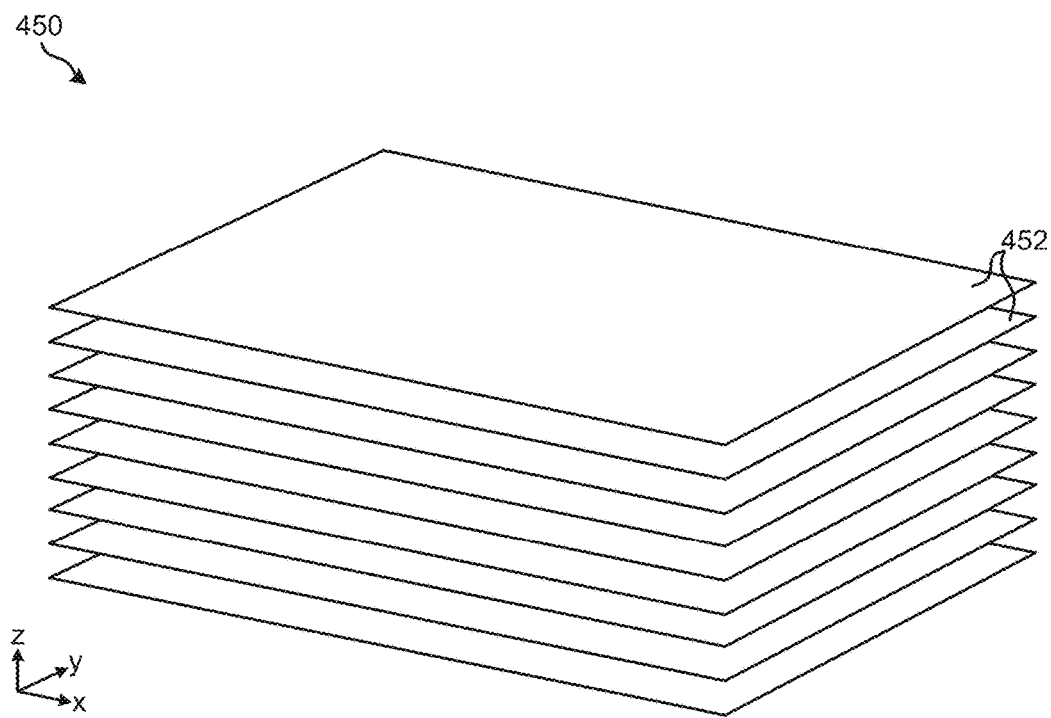
FIG. 4B is a partial perspective view of a 3-D non-volatile memory structure, in accordance with one embodiment.

The general storage architecture illustrated in the conceptual diagram 400 of FIG. 4A is also implemented by using 3-D memory structures in some approaches. For instance, FIG. 4B depicts a representational view of a 3-D non-volatile memory structure 450, in accordance with one embodiment. As an option, the present structure 450 may be implemented in conjunction with features from any other embodiment listed herein, such as those described with reference to the other FIGS., such as FIG. 4A. However, such structure 450 and others presented herein may be used in various applications and/or in permutations which may or may not be specifically described in the illustrative embodiments listed herein. Further, the structure 450 presented herein may be used in any desired environment. Thus FIG. 4B (and the other FIGS.) may be deemed to include any possible permutation.

As shown, each layer 452 of the 3-D non-volatile memory structure 450 extends along both the x-axis and the y-axis. Each of these layers 452 include a plurality of storage components (not shown), such as voltage supply lines, sensor stacks, transistors, etc., which are used to implement the non-volatile memory devices of the general storage architecture illustrated in the conceptual diagram 400 of FIG. 4A, e.g., as would be appreciated by one skilled in the art after reading the present description. Moreover, the various layers 452 are arranged in a stacked fashion along the z-axis in order to increase storage density and efficiency, e.g., by implementing shared wordlines. Cells from different bitlines along a wordline (typically in the x or y dimension of FIG. 4B) are logically combined to form pages: In TLC, each wordline in a block contains 3 physical pages (i.e., a lower page, an upper page, and an extra page) and a wordline typically belongs to one particular layer in the z dimension (perpendicular to the x-y plane). For a particular block, which is formed from a grid of cells connected by wordlines and bitlines, the number of wordlines residing on the same layer is typically small. Therefore, a block can be formed from wordlines of all layers 452. Moreover, wordlines as well as pages in the same block may reside on different layers 452.

Again, due to cycling, retention, read disturb, program disturb, etc., or other mechanisms that may be specific to the NAND storage technology (e.g., floating gate or charge trap), process technology (e.g., 2-D or 3-D), scaling node, etc., or other specific design factors, the programmed threshold voltage distributions in memory may change with writing and erasing data (cycling), reading data (read disturb), time (retention), etc., in a slow or fast manner. In other words, bit error rates for Flash memory blocks increase with time and use. As memory blocks are used, each program/erase (P/E) cycle performed on the blocks causes damage, which in turn increases the corresponding bit error rate.

Moreover, although increases in bit error rates due to retention and/or read disturbances are not permanent in the sense that the memory blocks affected are not being irreversibly damaged, these unfavorable declines in performance are only remedied when the memory blocks are erased or re-calibrated. Thus, block calibration, also known as read voltage shifting, is an important aspect of enhancing endurance and retention for storage systems, e.g., particularly enterprise-level Flash systems. This block calibration corresponds to the read voltages and refers to algorithms that are able to track the changes of the threshold voltages. Moreover, adjustments to the read voltages are applied during a read command accordingly. It follows that the threshold voltage represents the voltage required to turn on the transistor of a given Flash memory cell and its value depends on the amount of charge stored during programming. However, the read voltage is a bias voltage, the value of which is typically between the threshold voltage of two adjacent logical states, e.g., as is explained in further detail below in FIG. 5.

Figure 5:
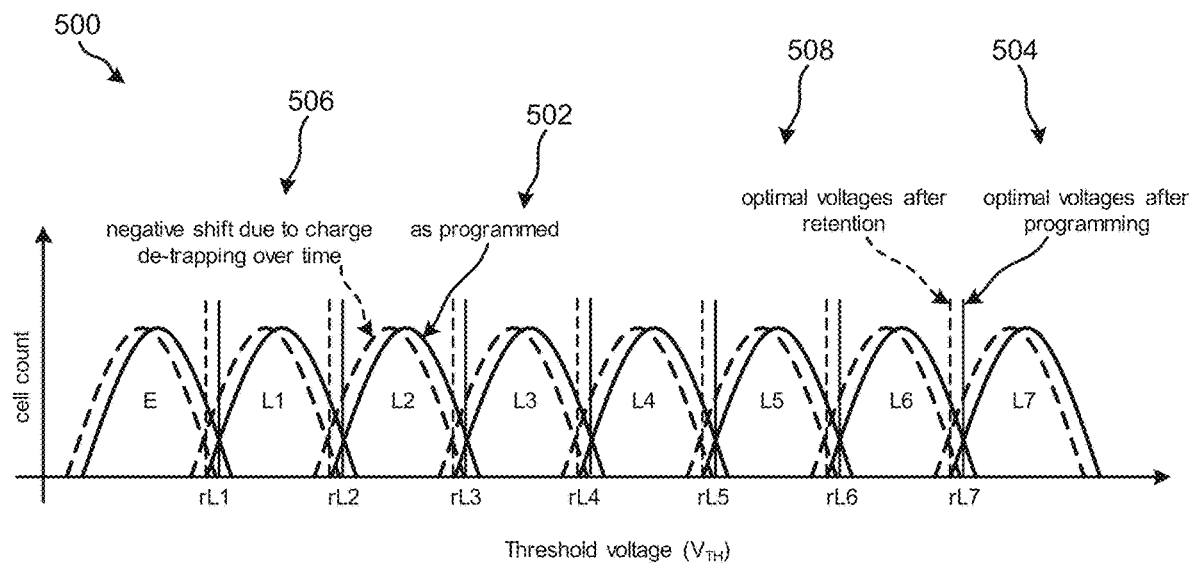
FIG. 5 is a graph which illustrates the threshold voltage shifting phenomenon, in accordance with one embodiment.

Referring momentarily to FIG. 5, a graph 500 illustrating the threshold voltage shifting phenomenon is illustrated in accordance with an example. The x-axis of the graph 500 represents the programmed threshold voltage VTH, while the y-axis represents the corresponding cell count of a TLC NAND memory block. In TLC NAND, each memory cell stores 3 bits of information, therefore, the VTH distributions correspond to 8 possible discrete levels (E, L1, . . . , L7). The solid distributions 502 indicate the VTH levels after programming. The vertical solid lines 504 indicate the read voltages (rL1, . . . , rL7) that are optimal for the VTH distributions 502. The dashed distributions 506 indicate a negative shift of the VTH levels due to charge loss over time. Because of this negative shift to lower voltages, the read voltages 504 are no longer optimal. Indeed, a negative offset must be applied to the read voltages in order to account for the changes of the VTH distributions from 502 to 506. The vertical dashed lines 508 indicate the read voltages (rL1, . . . , rL7) that are optimal during retention for the VTH distributions in 506. In general, each of the 8 levels (E, L1, . . . , L7) shown in the figure may have a different VTH shifts and thus, each of the 7 read voltages (rL1, . . . , rL7) may have a different optimal shift.

Accordingly, the read voltage shift values are preferably determined shortly after a block has been written to and/or periodically thereafter. The threshold voltage can be considered an index of the memory state, as determined by measuring the source-drain current when a control gate bias is applied to the memory cell. Typically, upon a read operation, a read voltage between adjacent nominal threshold voltages is used to determine the memory cell state. As the threshold voltage value of the memory cell changes (as explained above), the read voltage applied during a read operation is preferably shifted using a read voltage shift value to obtain optimal readout conditions and minimize bit error rates. Subsequently, the optimal read voltage shift values may be updated periodically, e.g., in a background health check.

Previous attempts to maintain efficient memory BER performance typically included inspecting the read voltages for each block of memory in a sweeping fashion or by a read voltage shifting algorithm that tracks and corrects the read voltages depending on how the threshold voltage distributions have changed as a result of cycling or retention or other disturbing effects. Moreover, upon identifying a block which was a calibration candidate, these previous attempts would perform block-level calibrations in which all pages in the identified block would be calibrated. It follows that these previous attempts involved inspecting each block in memory individually. Furthermore, although a block of memory is identified as being a candidate for calibration, typically not all pages in the block benefit from the calibration. Accordingly, these previous attempts suffered from significant inefficiencies not only in the process of identifying portions of memory which were in need of calibration, but also in performing the calibration process itself, as numerous pages would often be unnecessarily calibrated. Moreover, in modern 3-D TLC and QLC NAND flash, the number of pages in a block and the number of blocks in a package have been substantially increased with respect to previous generation 2-D NAND Flash. As a result, it may take longer before a particular page or block is inspected during the regular background process. Accordingly, these previous attempts suffered from high RBER triggering events of higher probability due to the longer times before the corresponding pages or blocks are inspected.

Figure 6:
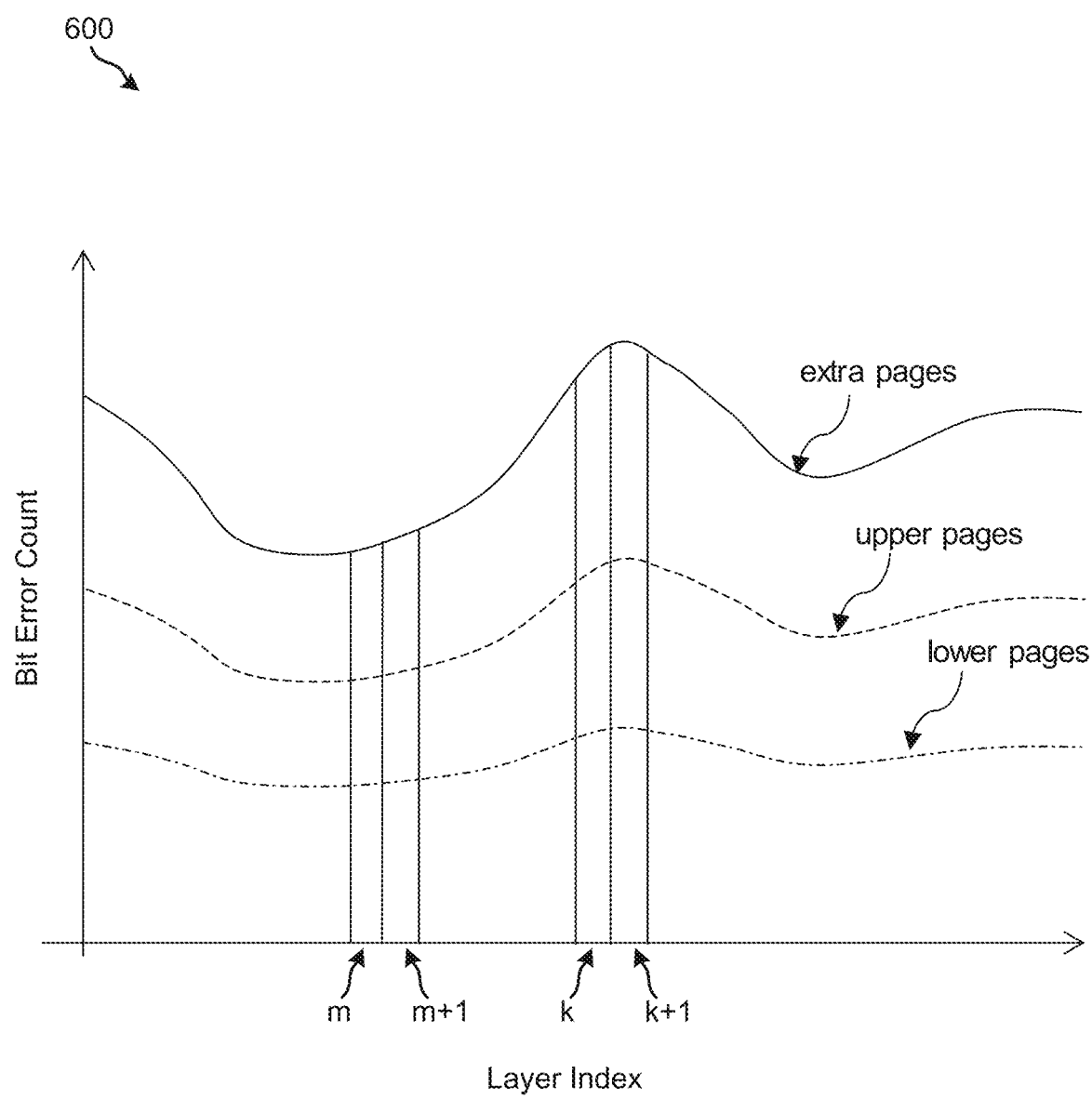
FIG. 6 is a graph which illustrates the bit error rate for various pages, in accordance with one embodiment.

These inefficiencies were realized mainly as a result of a discovery made regarding a bit error rate correlation which exists between various pages in memory. For instance, referring momentarily to FIG. 6, a graph 600 which illustrates the bit error rate for various pages in a 3D TLC block is illustrated in accordance with an exemplary embodiment, which is in no way intended to limit the invention. As shown, multiple levels of bit error rate correlation exist across different pages in the memory block. For instance, the lower pages have in general lower BER than the upper pages which have in general lower BER than the extra pages. It follows that pages of different types, but which are in the same block of memory have different bit error rate characteristics. Moreover, pages of the same type and in the same layer have similar bit error rate characteristics. Further, there exist pages of the same type in adjacent layers that have similar characteristics, e.g., the pages of same type in layers "m" and "m+1" or in layers "k" and "k+1". However, there also exists layers where the pages of the same type have different bit error rate characteristics, e.g., the pages of same type in layers "m" and "k".

It follows that these various correlations between the bit error rate characteristics of different portions of memory are utilized in some of the embodiments presented herein. For instance, by establishing a process which applies the different levels of bit error rate correlation to the calibration process, the calibration of a particular page group can also trigger the calibration of specific portions of memory which are correlated thereto. Thus, a number of the embodiments included herein are able to increase the efficiency by which memory is maintained, particularly with respect to the threshold voltage shift phenomenon, e.g., as will be described in further detail below.

Figure 7A:
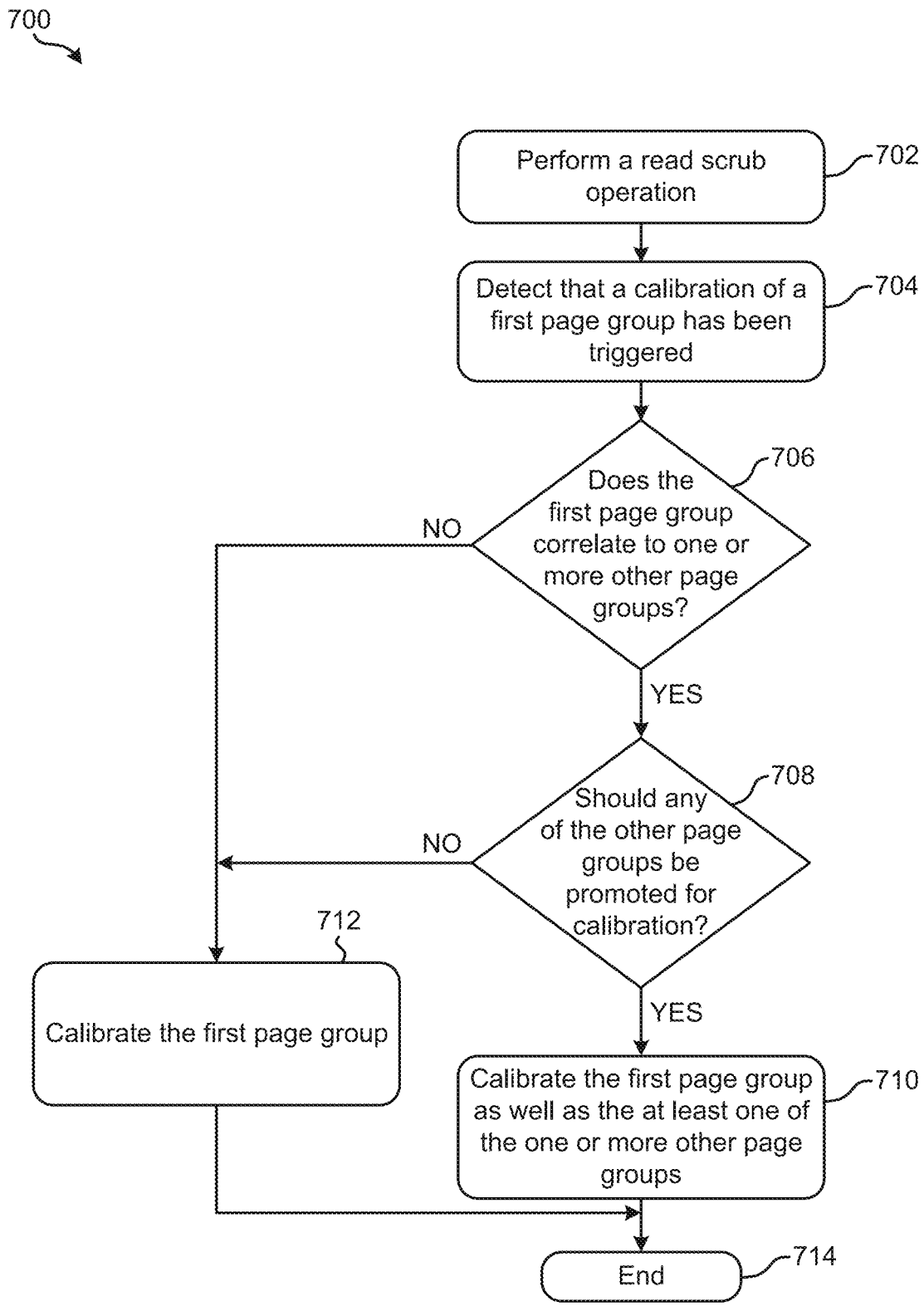
FIG. 7A is a flowchart of a method, in accordance with one embodiment.

Referring now to FIG. 7A, a flowchart of a method 700 is shown according to one embodiment. The method 700 may be performed in accordance with the present invention in any of the environments depicted in FIGS. 1-6, among others, in various embodiments. Of course, more or less operations than those specifically described in FIG. 7A may be included in method 700, as would be understood by one of skill in the art upon reading the present descriptions.

Each of the steps of the method 700 may be performed by any suitable component of the operating environment. For example, in various embodiments, the method 700 may be partially or entirely performed by a controller, a processor, a computer, etc., or some other device having one or more processors therein. Thus, in some embodiments, method 700 may be a computer-implemented method. It should also be noted that the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of the method 700. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 7A, operation 702 of method 700 includes performing a read scrub operation which monitors the status of the various pages in non-volatile memory by reading the given page and measuring the resulting bit error rate. The read scrub operation is preferably performed in the background such that it does not hinder the performance of ongoing data access and/or modification operations. Moreover, in some approaches the read scrub operation inspects the threshold voltage of each page or block in a sequential manner, an interleaved manner, or any other manner depending on how often or how fast the pages, the page groups, or the blocks benefit from inspection. Upon inspecting all portions of memory, the read scrub operation returns to inspect each of the portions of memory again in a repeating, cyclical manner such that a status of the memory is continuously being evaluated.

While the general progression of the read scrub operation is similar to that implemented in the aforementioned previous attempts, the manner by which the memory is calibrated as a result of detecting a portion of memory due for calibration differs significantly from the previous shortcomings, e.g., as will soon become apparent. Moreover, these improvements are achievable for various types of memory, including but not limited to two-dimensional (2-D) or 3-D NAND Flash memory (e.g., as seen in FIG. 4B), non-volatile memory implementing TLCs, non-volatile memory implementing quad-level cells (QLCs), etc.

Operation 704 includes detecting that a calibration of a first page group has been triggered. In other words, operation 704 includes detecting a first page group that is due for calibration. With respect to the present description, a "page group" is intended to refer to a grouping of one or more pages in non-volatile memory (e.g., NAND Flash) for which a bit error rate correlation exists therebetween. Thus, each of the pages included in a given page group have the same or substantially similar bit error rate characteristics over a given amount of time, use, etc., and therefore will also have the same or substantially similar read voltages. The pages which are included in a given page group may belong to the same to the same layer in a 3-D NAND Flash. In principle, the pages in the same group belong to the same block, however other approaches of grouping pages that belong to different blocks can be envisioned without deviating from the scope of the current application. Again, multiple levels of bit error rate correlation exist across different page types and different blocks of memory, e.g., as described with respect to FIG. 6 above.

In some approaches, the calibration of a given page group is triggered by a bit error rate of the given page group. For instance, determining that the bit error rate of a page group is too high may indicate that a threshold voltage distribution change has occurred. Thus, the detection in operation 704 may be made in response to measuring the number of errors incurred by reading any or a subset or all pages of the page group. It follows that the detection is made in response to performing a probe (e.g., test) read operation which attempts to determine whether the threshold voltage has deviated from an anticipated value by means of the returned bit error count.

Furthermore, decision 706 includes determining whether the first page group correlates to one or more other page groups in non-volatile memory by evaluating a hierarchical page group mapping. As described above, multiple levels of bit error rate correlation exist across different page types and different blocks of memory. For instance, pages that are in adjacent (e.g., neighboring) wordlines and/or which are of the same type (e.g., lower page, extra page, upper page, top page, etc.) will generally have similar characteristics which are different than the characteristics of other pages in different wordlines and/or which are of a different type. Thus, the hierarchical mapping is based on the principle that a bit error rate correlation exists between particular levels of memory which extends between pages, page groups, super-groups, layers, blocks, etc.

These correlations are thereby used in preferred approaches to develop a hierarchical page group mapping which identifies functional relationships between various portions of memory. Moreover, these relationships serve as valuable information in maintaining efficient BER performance of the memory as a whole, e.g., as would be appreciated by one skilled in the art after reading the present description. Accordingly, the page groups having a bit error rate correlation with a page group designated for calibration are referred to herein as a "super-group of page groups". Said another way, a super-group of page groups includes those page groups having a bit error rate correlation with a page group designated for calibration. Similarly, a given page group may have a bit error rate correlation with a super-group of layers, a super-group of blocks, etc. Also note that a super-group of page groups may include a part of a block, or an entire block depending on the approach.

However, the relationships represented in a hierarchical page group mapping are developed using other criteria and/or dependencies in some approaches. For example, apart from correlations based on similar BER characteristics, hierarchical mappings may be based on super groups of pages which are defined based on having similar cycling history, retention history, etc.

Furthermore, in some approaches the hierarchical page group mapping is static in the sense that relationships which exist between page groups and/or the specific pages included therein remain constant over time and throughout use. In such approaches, the hierarchical page group mapping may be based on a bit error rate correlation which exists between the pages in the non-volatile memory as determined using characteristic data of the non-volatile memory gathered during manufacture of the non-volatile memory and/or the product testing phase before being released for actual use.

However, the bit error rate correlation which exists between the pages in the non-volatile memory may change over time and with use. For example, different ones of the pages in a given page group can experience varied write cycles and therefore different wear rates. Accordingly, in other approaches the hierarchical page group mapping is updated over time (e.g., during actual use) based on such changes to the bit error rate correlation between the page groups in the non-volatile memory and/or the specific pages included therein. These updates to the hierarchical page group mapping may be performed periodically, in response to receiving a user request to do so, in response to a predetermined condition being met, etc.

Figure 7B:
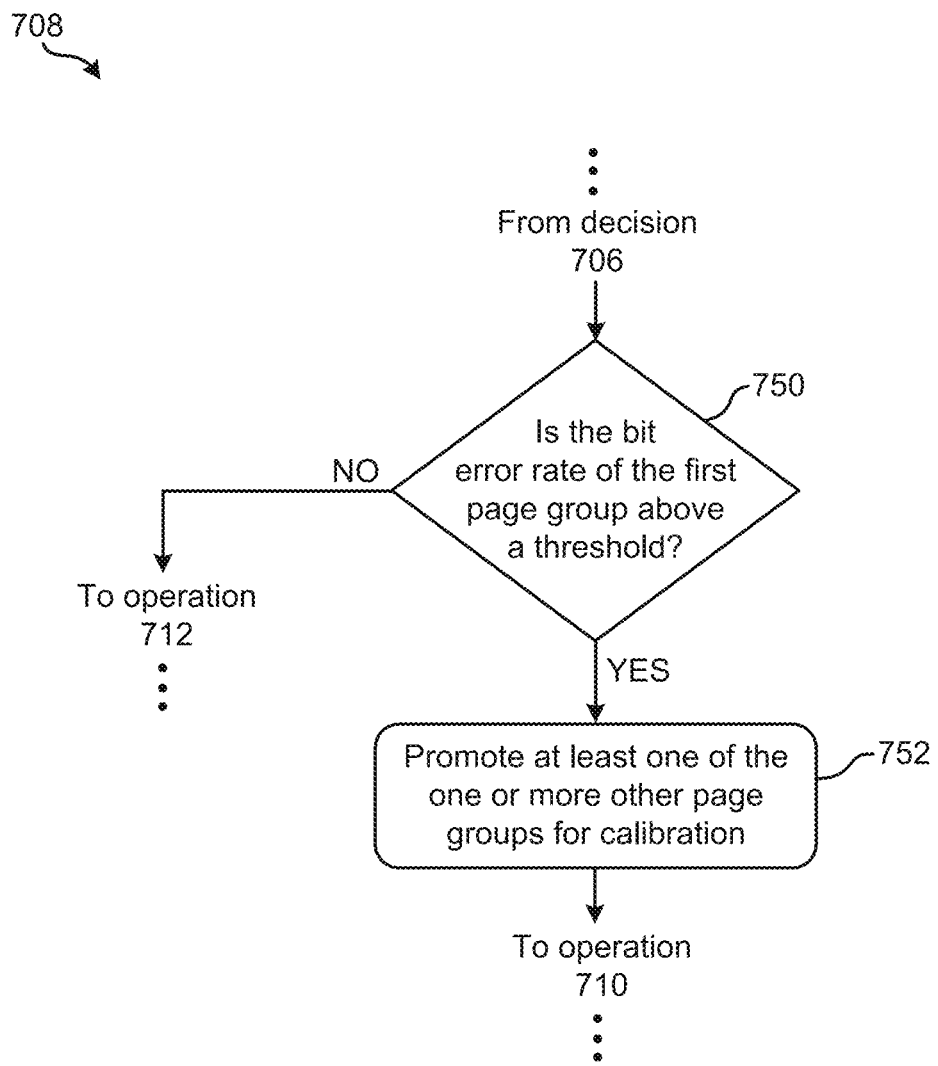
FIG. 7B is a flowchart of sub-processes for one of the operations in the method of FIG. 7A, in accordance with one embodiment.

With continued reference to FIG. 7A, method 700 proceeds to decision 708 in response to determining that the first page group does correlate to one or more other page groups in the non-volatile memory. There, decision 708 includes determining whether to promote at least one of the one or more other page groups for calibration. The determination made in decision 708 depends on various factors in different approaches. For instance, in some approaches the determination made in decision 708 is based on a bit error rate of the first page group detected in operation 704. Referring momentarily to FIG. 7B, exemplary sub-processes of determining whether to promote at least one of the one or more other page groups for calibration are illustrated in accordance with one embodiment, one or more of which may be used to perform decision 708 of FIG. 7A. However, it should be noted that the sub-processes of FIG. 7B are illustrated in accordance with one embodiment which is in no way intended to limit the invention.

As shown, the flowchart includes determining whether a bit error rate of the first page group is above a threshold. See decision 750. Determining that the bit error rate for a given page group is sufficiently high (undesirable) is a good indicator that page groups having bit error rate correlations with the given page group also have undesirably high bit error rates. Thus, the bit error rate of a given page group allows for other portions of memory which would greatly benefit from a calibration operation to be identified.

Depending on the approach, the threshold may be predetermined, set by a user, calculated based on current conditions and/or memory performance, etc. Moreover, it should be noted that "above a threshold" is in no way intended to limit the invention. Rather than determining whether a value is above a threshold, equivalent determinations may be made, e.g., as to whether a value is within a predetermined range, whether a value is outside a predetermined range, whether an absolute value is above a threshold, whether a value is below a threshold, etc., depending on the desired approach.

With continued reference to FIG. 7B, the flowchart proceeds to sub-operation 752 in response to determining that the bit error rate of the first page group is above the threshold. There, sub-operation 752 includes promoting at least one of the one or more other page groups for calibration. A number of the one or more other page groups which are promoted for calibration is based at least in part on the bit error rate of the first page group in some approaches. As alluded to above, the bit error rate of the first page group serves as an indicator on how each of the page groups correlated thereto are performing as well, e.g., at least to some extent. Thus, situations in which the first page group has a higher bit error rate results in a greater number of page groups being promoted for calibration, at least with respect to situations in which the first page group has a relatively lower bit error rate.

From sub-operation 752, the flowchart returns to operation 710 of FIG. 7A. However, returning to decision 750, the flowchart proceeds to operation 712 of FIG. 7A in response to determining that the bit error rate of the first page group is not above the threshold, e.g., as will be described in further detail below.

Figure 7C:
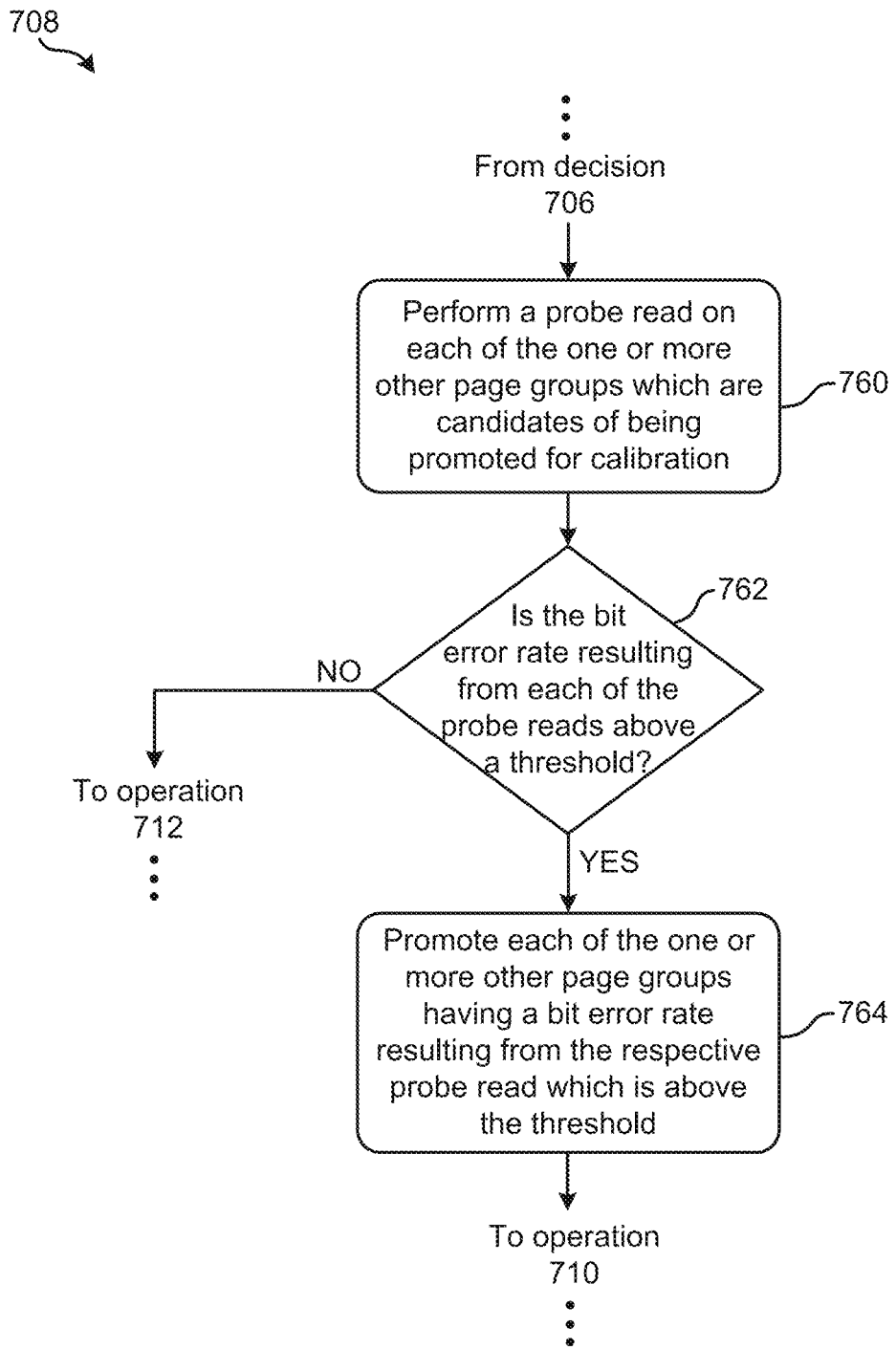
FIG. 7C is a flowchart of sub-processes for one of the operations in the method of FIG. 7A, in accordance with one embodiment.

Again, the determination made in decision 708 of FIG. 7A depends on various factors in different approaches. For instance, in other approaches the determination made in decision 708 is based on the results of performing probe read operations. Referring momentarily to FIG. 7C, exemplary sub-processes of determining whether to promote at least one of the one or more other page groups for calibration are illustrated in accordance with one embodiment, one or more of which may be used to perform decision 708 of FIG. 7A. However, it should be noted that the sub-processes of FIG. 7C are illustrated in accordance with one embodiment which is in no way intended to limit the invention.

As shown, the flowchart includes performing a probe read on each of the one or more other page groups which are candidates of being promoted for calibration. See sub-operation 760. A probe read performed on a given page group allows for the one or more pages included therein to be tested in terms of read performance with respect to the given threshold voltage used thereby. In other words, operation 760 allows for each of the candidate page groups to be evaluated before actually performing a calibration thereof, thereby conserving system resources and focusing management efforts on portions of memory which would actually benefit therefrom.

Furthermore, decision 762 includes determining whether a bit error rate resulting from each of the probe reads performed is above a threshold. In some approaches, this threshold may be the same as that use in decision 750 of FIG. 7B. However, in other approaches, this threshold may vary depending on the particular page group being evaluated, user preference, a level of correlation with the page group which originally triggered the calibration process in operation 704, etc.

The flowchart further proceeds to sub-operation 764 for each of the page groups determined as having a bit error rate (resulting from the respective probe read) which is above the threshold. There, sub-operation 764 includes promoting each of the one or more other page groups having a bit error rate resulting from the respective probe read which is above the threshold. In other words, sub-operation 764 includes selecting certain page groups having sufficiently high bit error rates for calibration. Accordingly, the page groups which are promoted may be added to a calibration queue, marked for calibration (e.g., using a special flag), etc., depending on the approach.

From sub-operation 764, the flowchart returns to operation 710 of FIG. 7A. However, returning to decision 762, the flowchart proceeds to operation 712 of FIG. 7A in response to determining that none of the bit error rates resulting from the probe reads performed are above a threshold, e.g., as will be described in further detail below.

Again, the flowchart of FIG. 7C is preferably performed for each page included in the page group being evaluated for calibration. Accordingly, in preferred approaches the sub-processes included therein are repeated in an iterative fashion for each of the pages included in a page group. Another approach is to randomly select one page or a subset of pages of the page group and measure the bit error rate for only that page or the subset of pages. This approach reduces the amount of probe reads.

Returning now to FIG. 7A, method 700 proceeds to operation 710 from decision 708 in response to determining to promote at least one of the one or more other page groups for calibration, e.g., as shown. There, operation 710 includes calibrating the first page group as well as the at least one of the one or more other page groups. In other words, operation 710 includes calibrating the page group which was originally detected in operation 704 as well as each of the additional page groups identified and promoted as a result of performing decision 708 and the various sub-processes included therein. As mentioned above, the number of the one or more other page groups which are ultimately promoted for calibration along with the originally detected page group is based at least in part on the bit error rate of the first page group in some approaches. Thus, the total number of page groups calibrated in operation 710 corresponds to on the bit error rate of the initial page group in some approaches.

Returning to decision 706, method 700 proceeds to operation 712 in response to determining that the first page group does not correlate to any other page groups in non-volatile memory. As mentioned above, this determination is made by evaluating a hierarchical page group mapping. Similarly, method 700 proceeds from decision 708 to operation 712 in response to determining to not promote any of the one or more other page groups for calibration. Looking back to FIGS. 7B-7C, this determination is made based on results of probe read operations, bit error rates, etc., depending on the approach.

Referring again to FIG. 7A, operation 712 includes calibrating the first page group. In other words, only the page group which was originally detected in operation 704 is calibrated in operation 712. Moreover, method 700 progresses from operation 712 as well as operation 710 to operation 714, whereby method 700 ends. However, it should be noted that although method 700 ends upon reaching operation 714 in some approaches, any one or more of the processes included in method 700 may be repeated in order to process additional page groups identified as being due from a calibration.

Accordingly, the various processes included in method 700 are able to evaluate the various pages in non-volatile memory and perform calibration operations on certain ones thereof in a manner which is more efficiently than previously achievable. For instance, by maintaining a hierarchical page group mapping, multiple page groups which have similar bit error rate characteristics can be identified and calibrated together when desirable. As a result, numerous pages which span across various layers, blocks, etc. of the memory can be identified and calibrated without having to systematically search for each of the pages individually as performed in previous attempts. Moreover, the granularity by which these calibrations are performed is much finer than previously achievable. Thus, unnecessary calibrations are avoided and system resources such as processing power, computational throughput, etc. are preserved. It follows that various ones of the approaches included herein are able to achieve a level of efficiency in the management and performance of memory which is orders of magnitude greater than achievable by conventional products.

While the approaches included in method 700 generally evaluated whether to promote additional page groups prior to performing any calibration operations, determinations as to whether to promote additional page groups may be made following an initial calibration operation in other approaches. For example, referring now to FIG. 8, another method 800 is illustrated in accordance with one embodiment. It should also be noted that various ones of the processes included in method 800 are similar to those presented above in method 700. Accordingly, any of the approaches presented above with respect to FIGS. 7A-7C may be implemented in conjunction with FIG. 8, e.g., as would be appreciated by one skilled in the art after reading the present description. Moreover, the method 800 may be performed in accordance with the present invention in any of the environments depicted in FIGS. 1-6, among others, in various embodiments. Of course, more or less operations than those specifically described in FIG. 8 may be included in method 800, as would be understood by one of skill in the art upon reading the present descriptions.

Each of the steps of the method 800 may be performed by any suitable component of the operating environment. For example, in various embodiments, the method 800 may be partially or entirely performed by a controller, a processor, a computer, etc., or some other device having one or more processors therein. Thus, in some embodiments, method 800 may be a computer-implemented method. It should also be noted that the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of the method 800. Illustrative processors include, but are not limited to, a central processing unit (CPU), an application specific integrated circuit (ASIC), a field programmable gate array (FPGA), etc., combinations thereof, or any other suitable computing device known in the art.

Figure 8:
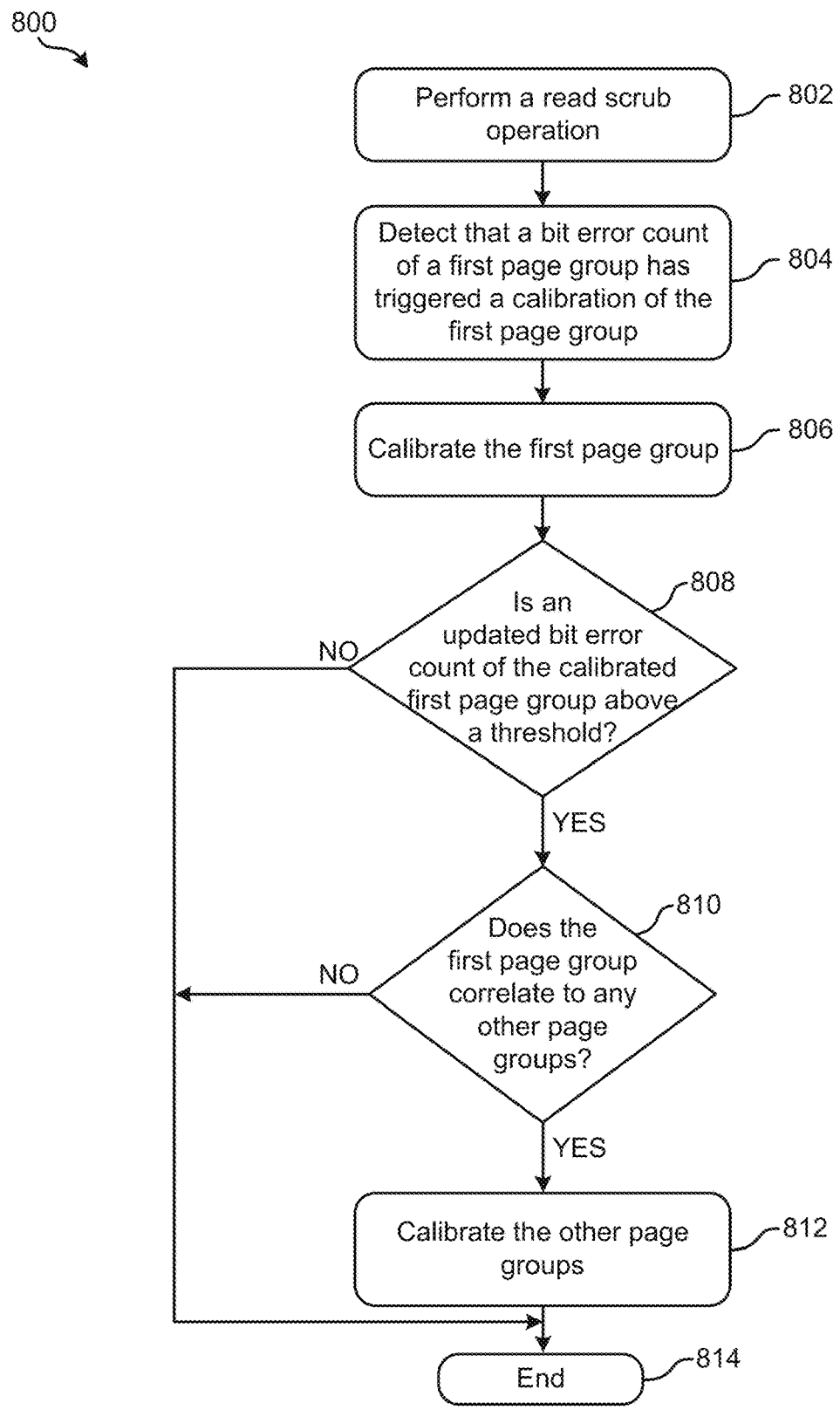
FIG. 8 is a flowchart of a method, in accordance with one embodiment.

As shown in FIG. 8, operation 802 of method 800 includes performing a read scrub operation which monitors the status of the various pages in non-volatile memory by reading the given page and measuring the resulting bit error rate. Moreover, operation 804 includes detecting that a bit error count of a first page group has triggered a calibration of the first page group. As mentioned above, the bit error rate of a given page group triggers a calibration of that page group in response to exceeding a threshold in some approaches. By exceeding the threshold, the bit error rate provides an indication that the read voltage for the corresponding pages is no longer accurate and thereby causing an increased number of errors in accessing data stored in the memory.

Proceeding to operation 806, here method 800 includes calibrating the first page group. The process of calibrating the first page group may implement any of the approaches described herein. Moreover, other calibration processes which would be apparent to one skilled in the art after reading the present description can be implemented, e.g., depending on the desired approach.

Decision 808 further includes determining whether an updated bit error count of the calibrated first page group is above a threshold. As described above, calibrating a given page of memory involves determining how much the threshold voltage thereof has shifted, and adjusting read settings accordingly. Thus, the bit error rate for a given page after being calibrated is typically lower than the bit error rate prior to the calibration. However, it is desirable in some approaches to inspect the updated bit error count of a page group after being calibrated, e.g., to ensure the calibration operation was performed successfully and that desirable read performance will be achieved moving forward. It should also be noted that "above a threshold" is again in no way intended to limit the invention. Rather than determining whether a value is above a threshold, equivalent determinations may be made, e.g., as to whether a value is within a predetermined range, whether a value is outside a predetermined range, whether an absolute value is above a threshold, whether a value is below a threshold, etc., depending on the desired approach.

In response to determining that the updated bit error count of the calibrated first page group exceeds the threshold, method 800 proceeds to decision 810. There, decision 810 includes determining whether the first page group correlates to one or more other page groups in non-volatile memory by evaluating a hierarchical page group mapping. Again, determining that the bit error rate for a given page group is sufficiently high (undesirable) is a good indicator that page groups having bit error rate correlations with the given page group also have undesirably high bit error rates. Thus, the bit error rate of a given page group allows for other portions of memory which would greatly benefit from a calibration operation to be identified.

Again, multiple levels of bit error rate correlation exist across different page types and different blocks of memory. For instance, pages that are in adjacent (e.g., neighboring) wordlines and/or which are of the same type (e.g., lower page, extra page, etc.) will generally have similar characteristics which are different than the characteristics of other pages in different wordlines and/or which are of a different type. Thus, the hierarchical mapping is based on the principle that a bit error rate correlation exists between particular levels of memory which extends between pages, page groups, super-groups, layers, blocks, etc.

As previously mentioned, these correlations are thereby used in preferred approaches to develop a hierarchical page group mapping which identifies functional relationships between various portions of memory. These relationships also serve as valuable information in maintaining efficient BER performance of the memory as a whole, e.g., as would be appreciated by one skilled in the art after reading the present description. In some approaches the hierarchical page group mapping is static in the sense that relationships which exist between page groups and/or the specific pages included therein remain constant over time and throughout use, e.g., according to any of the approaches included herein. However, in other approaches the hierarchical page group mapping is updated over time (e.g., during actual use) based on such changes to the bit error rate correlation between the page groups in the non-volatile memory and/or the specific pages included therein, e.g., according to any of the approaches included herein.

In response to determining that the first page group does correlate to one or more other page groups in the non-volatile memory, operation 812 is performed which includes calibrating at least one of the one or more other page groups. As mentioned above, a number of the one or more other page groups which are calibrated is based at least in part on the bit error rate and/or the updated bit error rate of the first page group with respect to the thresholds, respectively.

The flowchart proceeds from operation 812 to operation 814, whereby method 800 may end. Method 800 is also shown as progressing to operation 814 from decision 808 in response to determining that an updated bit error count of the calibrated first page group is not above a threshold. Similarly, method 800 proceeds directly to operation 814 from decision 810 in response to determining that the first page group does not correlate to any other page groups in non-volatile memory. However, it should be noted that although method 800 may end upon reaching operation 814, any one or more of the processes included in method 800 may be repeated in order to process additional page groups identified as being due from a calibration.

Again, the various processes included in method 800 are able to evaluate the various pages in non-volatile memory and perform calibration operations on certain ones thereof in a manner which is more efficiently than previously achievable. For instance, by maintaining a hierarchical page group mapping, multiple page groups which have similar bit error rate characteristics can be identified and calibrated together when desirable, despite the fact that the various page groups may be located across different layers, blocks, etc. of the memory. As a result, numerous pages which span across the memory can be identified and calibrated without having to systematically search for each of the pages individually as performed in previous attempts. Moreover, the granularity by which these calibrations are performed is much finer than previously achievable. Thus, unnecessary calibrations are avoided and system resources such as processing power, computational throughput, etc. are preserved. It follows that various ones of the approaches included herein are able to achieve a level of efficiency in the management and performance of memory which is orders of magnitude greater than achievable by conventional products.

According to an in-use example of a 3-D TLC NAND Flash, which is in no way intended to limit the invention, assume page group "j" with an upper page in layer "k" of block "b" triggers a calibration. Because the bit error rate of an upper page is typically less than the bit error rate of an extra page, it is likely that page group "i" of block "b" having the shared extra pages would also benefit from a calibration. Moreover, because page groups "i" and "j" both belong to layer "k", it is likely that the same type of groups (e.g., those having upper pages and those having extra pages) in the adjacent layers "k−1", "k+1" of block "b" would benefit from a calibration operation also. Further still, the approaches included herein are able to determine that because page group "j" in block "b" triggered the calibration in the first place, it is likely that blocks "b+1" and "b+2" (e.g., which were written together with block "b" and have seen the same number and/or frequency of program erase cycles and/or read cycles) would benefit from a calibration operation as well.

It follows that, given the different levels of bit error rate correlation, the approaches included herein establish a process which, depending on whether a particular page group triggers calibration, promotes one or more page groups, one or more layers, one or more blocks, etc., for calibration. In other words, portions of memory are queued for calibration given a hierarchical mapping between the triggering page group and the other page groups, layers, blocks, etc. Also note that the page groups may include a part of a block, or an entire block depending on the approach.

Figure 9:
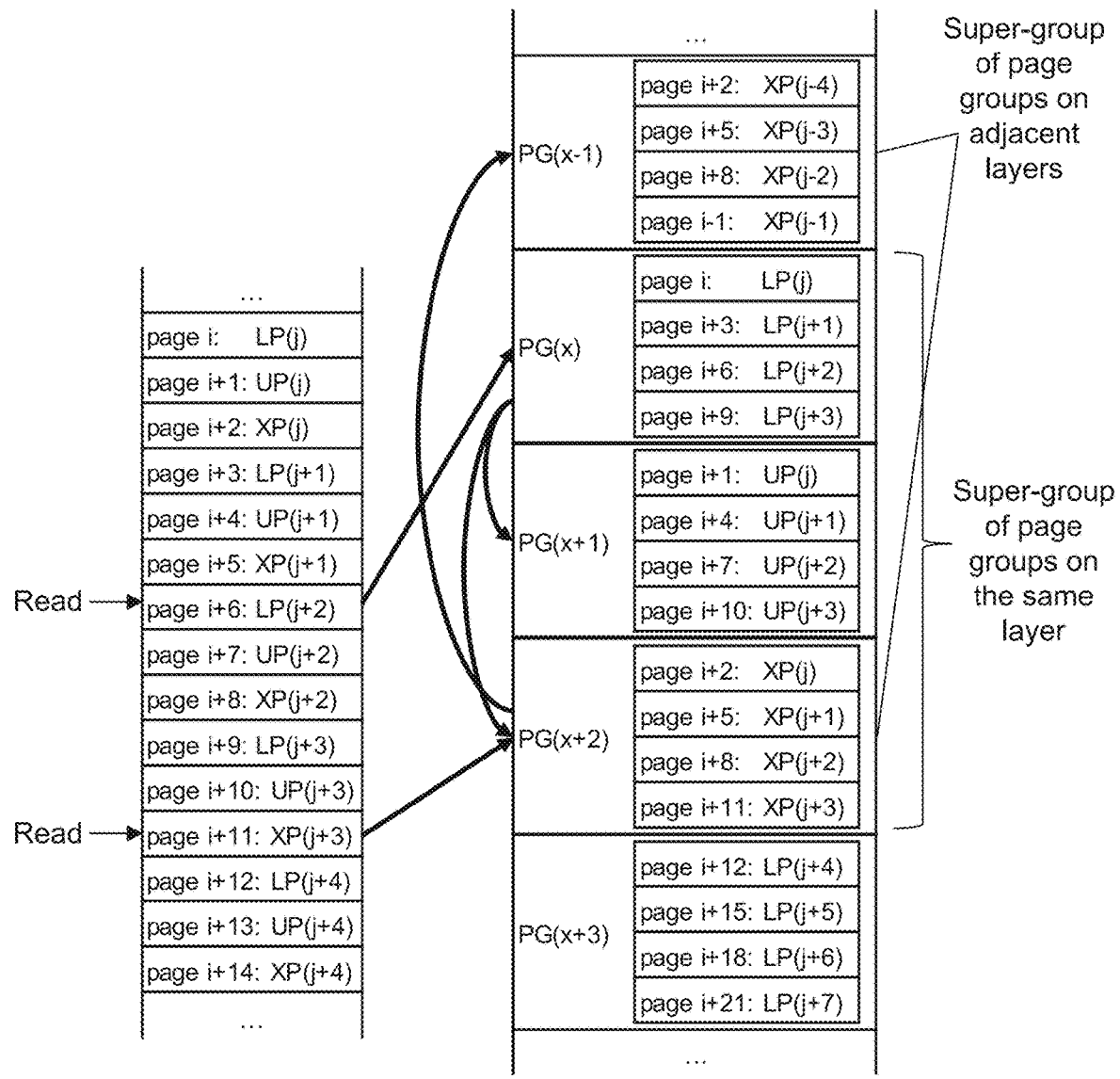
FIG. 9 is a partial representational view of non-volatile memory, in accordance with one embodiment.

Looking now to FIG. 9, a representational view of non-volatile memory 900 is illustrated in accordance with another in-use example of a 3-D TLC NAND Flash, which again is in no way intended to limit the invention. In the present example, the act of reading page "i+6" triggers a calibration of the page and of page group "x", shown as PG(X), that page "i+6" belongs to. According to a hierarchical page group mapping, a dependency exists between page "i+6" and page groups "x", "x+1", and "x+2". More specifically, page group "x" contains, in this example, four pages of the same type, i.e., lower pages (LP), that belong to four adjacent word lines, i.e., "j", "j+1", "j+2, "j+3, and pages groups "x+1" and "x+2" contain the corresponding shared upper pages (UP) and extra pages (XP), respectively. Accordingly, page groups "x", "x+1", and "x+2" may be considered as being a super-group of page groups which are correlated to page "i+6". It follows that page "i+6" as well as page groups "x", "x+1", and "x+2" are each calibrated as a result of the identified bit error rate correlation which exists therebetween.

While the super-group of page groups is located on a same layer as page "i+6" in the present approach, the page groups in a given super-group is located on different layers in other approaches. For instance, reading page "i+11" also triggers a calibration of the page and of page group "x+2", shown as PG(X+2), that page "i+11" belongs to. The hierarchical page group mapping identifies that a bit error rate correlation exists between page "i+11" and page groups "x−1", and "x+2". Accordingly, page groups "x−1", and "x+2" may be considered as being a super-group of page groups which are located on adjacent layers in memory, but which are also correlated to page "i+11". Accordingly, multiple levels of bit error rate correlation exist across the different page types (e.g., lower page, upper page, extra page, top page, etc.).

The approaches included herein focus on the calibration (e.g., normal or snap) on a page group basis while proactively promote page groups for calibration that have similar characteristics and use history (e.g., cycling, retention, etc.) with the page group that triggered calibration.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Figure 10:
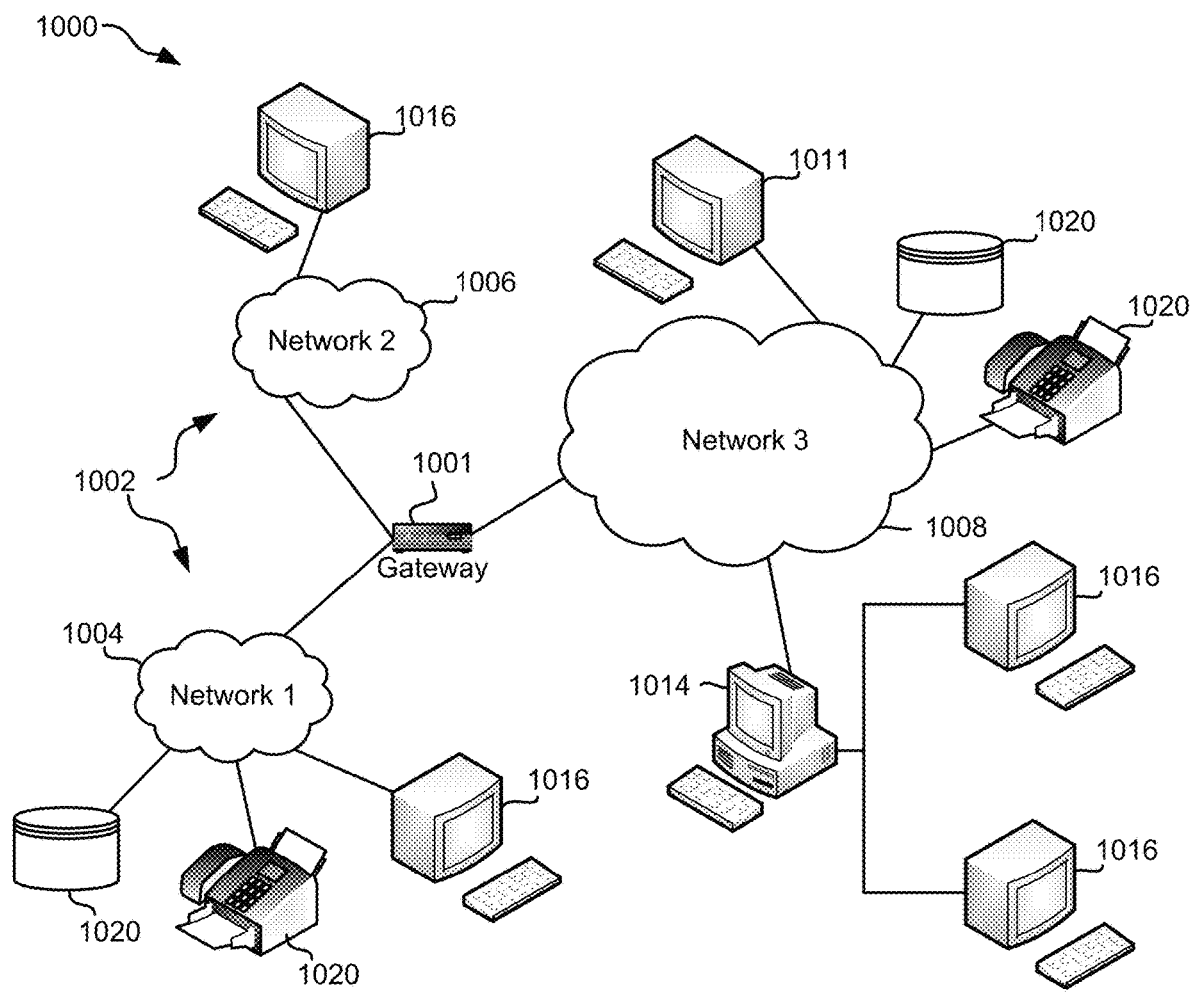
FIG. 10 is a network architecture, in accordance with one embodiment.

FIG. 10 illustrates a network architecture 1000, in accordance with one embodiment. As shown in FIG. 10, a plurality of remote networks 1002 are provided including a first remote network 1004 and a second remote network 1006. A gateway 1001 may be coupled between the remote networks 1002 and a proximate network 1008. In the context of the present network architecture 1000, the networks 1004, 1006 may each take any form including, but not limited to a LAN, a WAN such as the Internet, public switched telephone network (PSTN), internal telephone network, etc.

In use, the gateway 1001 serves as an entrance point from the remote networks 1002 to the proximate network 1008. As such, the gateway 1001 may function as a router, which is capable of directing a given packet of data that arrives at the gateway 1001, and a switch, which furnishes the actual path in and out of the gateway 1001 for a given packet.

Further included is at least one data server 1014 coupled to the proximate network 1008, and which is accessible from the remote networks 1002 via the gateway 1001. It should be noted that the data server(s) 1014 may include any type of computing device/groupware. Coupled to each data server 1014 is a plurality of user devices 1016. Such user devices 1016 may include a desktop computer, laptop computer, handheld computer, printer, and/or any other type of logic-containing device. It should be noted that a user device 1011 may also be directly coupled to any of the networks, in some embodiments.

A peripheral 1020 or series of peripherals 1020, e.g., facsimile machines, printers, scanners, hard disk drives, networked and/or local data storage units or systems, etc., may be coupled to one or more of the networks 1004, 1006, 1008. It should be noted that databases and/or additional components may be utilized with, or integrated into, any type of network element coupled to the networks 1004, 1006, 1008. In the context of the present description, a network element may refer to any component of a network.

According to some embodiments, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some embodiments.

In other embodiments, one or more networks 1004, 1006, 1008, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 11:
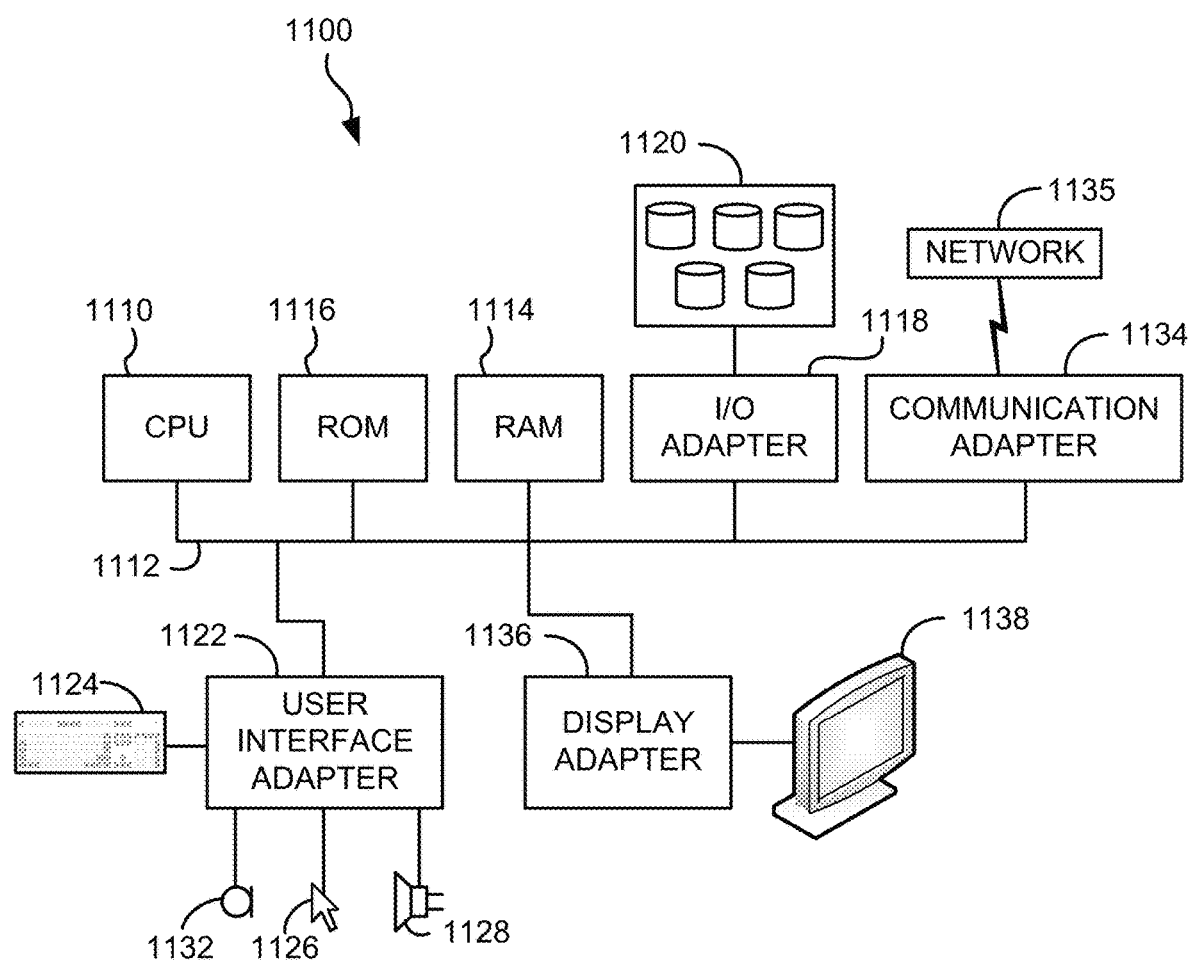
FIG. 11 is a representative hardware environment that may be associated with the servers and/or clients of FIG. 10, in accordance with one embodiment.

FIG. 11 shows a representative hardware environment associated with a user device 1016 and/or server 1014 of FIG. 10, in accordance with one embodiment. FIG. 11 illustrates a typical hardware configuration of a processor system 1100 having a central processing unit 1110, such as a microprocessor, and a number of other units interconnected via a system bus 1112, according to one embodiment. In some embodiments, central processing unit 1110 may include any of the approaches described above with reference to the one or more processors 210 of FIG. 2.

The processor system 1100 shown in FIG. 11 includes a Random Access Memory (RAM) 1114, Read Only Memory (ROM) 1116, and an I/O adapter 1118. According to some embodiments, which are in no way intended to limit the invention, I/O adapter 1118 may include any of the approaches described above with reference to I/O adapter 218 of FIG. 2. Referring still to processor system 1100 of FIG. 11, the aforementioned components 1114, 1116, 1118 may be used for connecting peripheral devices such as storage subsystem 1120 to the bus 1112. In some embodiments, storage subsystem 1120 may include a similar and/or the same configuration as data storage system 220 of FIG. 2. According to an example, which is in no way intended to limit the invention, storage subsystem 1120 may include non-volatile data storage cards, e.g., having NVRAM memory cards, RAM, ROM, and/or some other known type of non-volatile memory, in addition to RAID controllers as illustrated in FIG. 2.

With continued reference to FIG. 11, a user interface adapter 1122 for connecting a keyboard 1124, a mouse 1126, a speaker 1128, a microphone 1132, and/or other user interface devices such as a touch screen, a digital camera (not shown), etc., to the bus 1112.

Processor system 1100 further includes a communication adapter 1134 which connects the processor system 1100 to a communication network 1135 (e.g., a data processing network) and a display adapter 1136 which connects the bus 1112 to a display device 1138.

The processor system 1100 may have resident thereon an operating system such as the MICROSOFT WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 12:
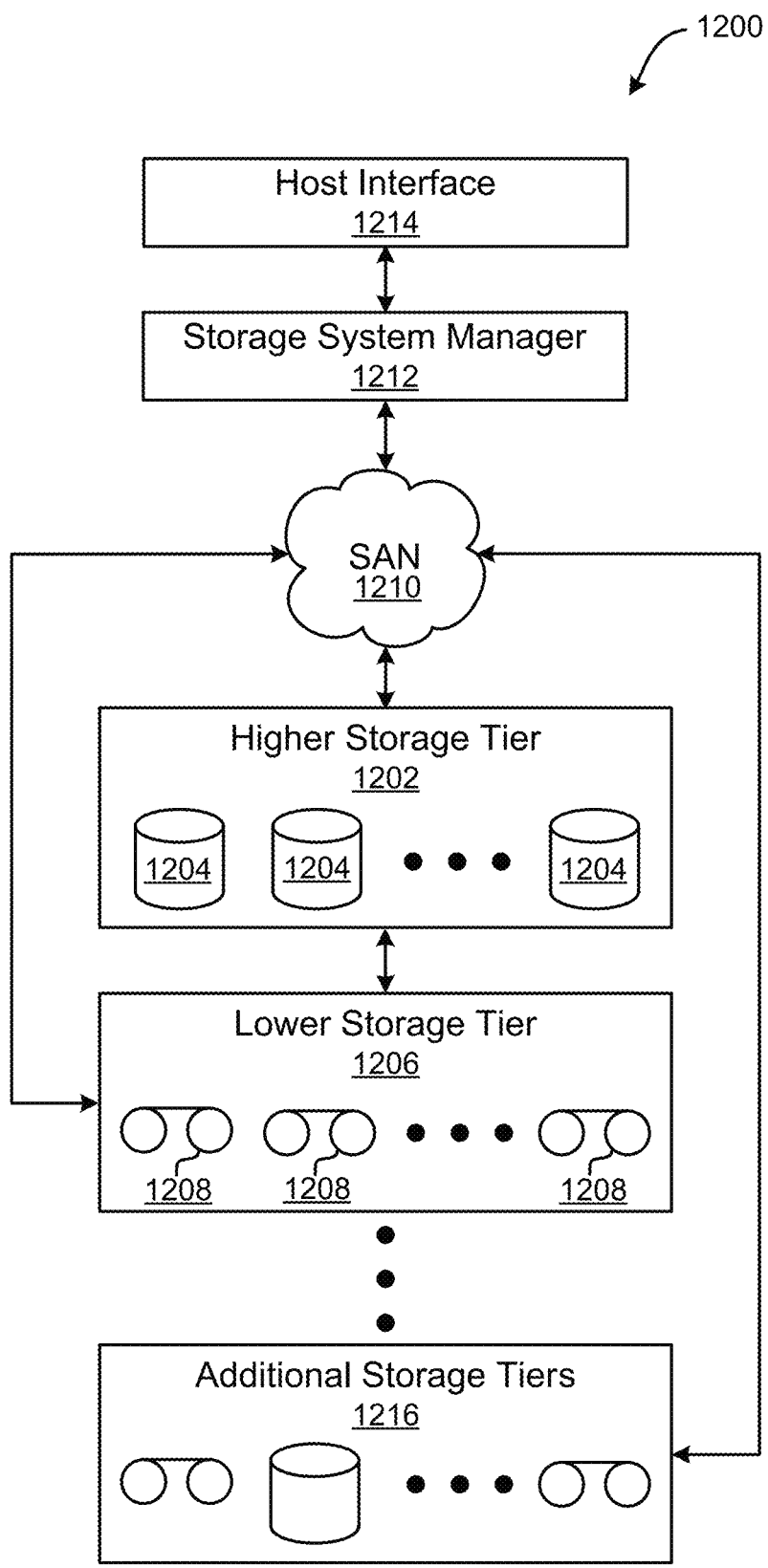
FIG. 12 is a tiered data storage system in accordance with one embodiment.

Moreover, FIG. 12 illustrates a storage system 1200 which implements high level (e.g., SSD) storage tiers in combination with lower level (e.g., magnetic tape) storage tiers, according to one embodiment. Note that some of the elements shown in FIG. 12 may be implemented as hardware and/or software, according to various embodiments. The storage system 1200 may include a storage system manager 1212 for communicating with a plurality of media on at least one higher storage tier 1202 and at least one lower storage tier 1206. However, in other approaches, a storage system manager 1212 may communicate with a plurality of media on at least one higher storage tier 1202, but no lower storage tier. The higher storage tier(s) 1202 preferably may include one or more random access and/or direct access media 1204, such as hard disks, nonvolatile memory (NVM), NVRAM), solid state memory in SSDs, flash memory, SSD arrays, flash memory arrays, etc., and/or others noted herein or known in the art. According to illustrative examples, FIGS. 3-4 show exemplary architectures of SSD systems which may be used as a higher storage tier 1202 depending on the desired embodiment.

Referring still to FIG. 12, the lower storage tier(s) 1206 preferably includes one or more lower performing storage media 1208, including sequential access media such as magnetic tape in tape drives and/or optical media, slower accessing HDDs, slower accessing SSDs, etc., and/or others noted herein or known in the art. One or more additional storage tiers 1216 may include any combination of storage memory media as desired by a designer of the system 1200. Thus, the one or more additional storage tiers 1216 may, in some approaches, include a SSD system architecture similar or the same as those illustrated in FIGS. 1-2. Also, any of the higher storage tiers 1202 and/or the lower storage tiers 1206 may include any combination of storage devices and/or storage media.

The storage system manager 1212 may communicate with the storage media 1204, 1208 on the higher storage tier(s) 1202 and lower storage tier(s) 1206 through a network 1210, such as a storage area network (SAN), as shown in FIG. 12, or some other suitable network type. The storage system manager 1212 may also communicate with one or more host systems (not shown) through a host interface 1214, which may or may not be a part of the storage system manager 1212. The storage system manager 1212 and/or any other component of the storage system 1200 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 1200 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1202, may include a majority of SSD storage media for storing data in a higher performing storage environment, and remaining storage tiers, including lower storage tier 1206 and additional storage tiers 1216 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1202, while data not having one of these attributes may be stored to the additional storage tiers 1216, including lower storage tier 1206. Of course, one of skill in the art, upon reading the present descriptions, may devise many other combinations of storage media types to implement into different storage schemes, according to the embodiments presented herein.

According to some embodiments, the storage system (such as 1200) may include logic configured to receive a request to open a data set, logic configured to determine if the requested data set is stored to a lower storage tier 1206 of a tiered data storage system 1200 in multiple associated portions, logic configured to move each associated portion of the requested data set to a higher storage tier 1202 of the tiered data storage system 1200, and logic configured to assemble the requested data set on the higher storage tier 1202 of the tiered data storage system 1200 from the associated portions.

Of course, this logic may be implemented as a method on any device and/or system or as a computer program product, according to various embodiments.

What is claimed is:

1. A computer-implemented method, comprising:
    detecting that an existing bit error rate of a first page group has triggered a calibration of a first page group as a result of performing a probe read operation on the first page group;
    calibrating the first page group in response to detecting that the existing bit error rate of the first page group has triggered the calibration of the first page group, wherein calibrating the first page group includes, for each page in the first page group:
        determining an amount by which a threshold voltage of the given page has shifted, and
        using the amount by which the threshold voltage of the given page has shifted to adjust read settings associated with the given page;
    determining whether an updated bit error rate of the calibrated first page group is above a threshold;
    in response to determining that the updated bit error rate of the calibrated first page group is above the threshold, evaluating a hierarchical page mapping to determine whether the first page group correlates to one or more other page groups in non-volatile memory;
    in response to determining that the first page group does correlate to one or more other page groups in the non-volatile memory, determining whether to promote at least one of the one or more other page groups for calibration; and
    in response to determining to promote at least one of the one or more other page groups for calibration, calibrating the at least one of the one or more other page groups,
    wherein each of the page groups includes one or more pages in non-volatile memory,
    wherein a number of the one or more other page groups which are promoted for calibration is based on the existing bit error rate of the first page group.

2. The computer-implemented method of claim 1, wherein the one or more pages in non-volatile memory included in each of the respective page groups have similar bit error rate characteristics, wherein the calibration of the first page group is triggered by a bit error rate of the first page group.

3. The computer-implemented method of claim 1, wherein determining whether to promote at least one of the one or more other page groups for calibration includes:
  determining whether the existing bit error rate of the first page group is above a threshold; and
  promoting at least one of the one or more other page groups for calibration in response to determining that the existing bit error rate of the first page group is above the threshold.

4. The computer-implemented method of claim 1, wherein determining whether to promote at least one of the one or more other page groups for calibration includes:
  performing a probe read on each of the one or more other page groups; and
  promoting each of the one or more other page groups having a bit error rate resulting from the respective probe read which is above a threshold.

5. The computer-implemented method of claim 1, wherein each of the at least one of the one or more other page groups include one or more pages which are positioned in a different layer and/or a different block of the non-volatile memory than the one or more pages included in the first page group.

6. The computer-implemented method of claim 5, wherein the non-volatile memory is a three-dimensional NAND Flash memory.

7. The computer-implemented method of claim 1, wherein the hierarchical page mapping is static and based on a bit error rate correlation which exists between the pages in the non-volatile memory.

8. The computer-implemented method of claim 1, wherein the hierarchical page mapping is updated over time based on changes to a bit error rate correlation which exists between the pages in the non-volatile memory.

9. A computer-implemented method, comprising:
  detecting that an existing bit error rate of a first page group has triggered a calibration of the first page group;
  calibrating the first page group in response to detecting that the existing bit error rate of the first page group has triggered the calibration of the first page group;
  determining whether an updated bit error rate of the calibrated first page group is above a threshold;
  in response to determining that the updated bit error rate of the calibrated first page group is above the threshold, evaluating a hierarchical page mapping to determine whether the first page group correlates to one or more other page groups in non-volatile memory; and
  in response to determining that the first page group does correlate to one or more other page groups in the non-volatile memory, calibrating a number of the one or more other page groups, wherein the number of the one or more other page groups which are promoted for calibration is based on the existing bit error rate of the first page group,
  wherein each of the page groups includes one or more pages in non-volatile memory.

10. The computer-implemented method of claim 9, wherein the one or more pages in non-volatile memory included in each of the respective page groups have similar bit error rate characteristics, wherein calibrating the number of the one or more other page groups includes:
  adding the number of the one or more other page groups to a calibration queue; and
  for each page in the number of the one or more other page groups:
    determining an amount by which a threshold voltage of the given page has shifted, and
    using the amount by which the threshold voltage of the given page has shifted to adjust read settings associated with the given page.

11. The computer-implemented method of claim 9, wherein each of the at least one of the one or more other page groups include one or more pages which are positioned in a different layer and/or a different block of the non-volatile memory than the one or more pages included in the first page group.

12. The computer-implemented method of claim 11, comprising:
  performing a read scrub operation; and
  detecting that the existing bit error rate of the first page group has triggered the calibration of the first page group in response to performing the read scrub operation,
  wherein the non-volatile memory is a three-dimensional NAND Flash memory.

13. The computer-implemented method of claim 9, wherein the hierarchical page mapping is static and based on a bit error rate correlation which exists between the pages in the non-volatile memory.

14. The computer-implemented method of claim 9, wherein the hierarchical page mapping is updated over time based on changes to a bit error rate correlation which exists between the pages in the non-volatile memory.

15. The computer-implemented method of claim 9, wherein the number of the one or more other page groups which are promoted for calibration is positively correlated with the existing bit error rate of the first page group.

16. A computer program product comprising a computer readable storage medium having program instructions embodied therewith, the program instructions readable and/or executable by a processor to cause the processor to perform a method comprising:
  detecting, by the processor, that an existing bit error rate of a first page group has triggered a calibration of a first page group as a result of performing a probe read operation on the first page group;
  calibrating, by the processor, the first page group in response to detecting that the existing bit error rate of the first page group has triggered the calibration of the first page group, wherein calibrating the first page group includes, for each page in the first page group:
    determining an amount by which a threshold voltage of the given page has shifted, and
    using the amount by which the threshold voltage of the given page has shifted to adjust read settings associated with the given page;
  determining, by the processor, whether an updated bit error rate of the calibrated first page group is above a threshold;
  in response to determining that the updated bit error rate of the calibrated first page group is above the threshold, evaluating, by the processor, a hierarchical page mapping to determine whether the first page group correlates to one or more other page groups in non-volatile memory;
  in response to determining that the first page group does correlate to one or more other page groups in the non-volatile memory, determining, by the processor, whether to promote at least one of the one or more other page groups for calibration; and in response to determining to promote at least one of the one or more other page groups for calibration, calibrating, by the processor, the at least one of the one or more other page groups, wherein a number of the one or more other page groups which are promoted for calibration is based on the existing bit error rate of the first page group, wherein each of the page groups includes one or more pages in non-volatile memory.

17. The computer program product of claim 16, wherein determining whether to promote at least one of the one or more other page groups for calibration includes:

determining whether the existing bit error rate of the first page group is above a threshold; and promoting a number of the one or more other page groups for calibration in response to determining that the existing bit error rate of the first page group is above the threshold, wherein the number of the one or more other page groups which are promoted for calibration is positively correlated with the existing bit error rate of the first page group.

18. The computer program product of claim 16, wherein determining whether to promote at least one of the one or more other page groups for calibration includes:

performing a probe read on each of the one or more other page groups; and promoting each of the one or more other page groups having a bit error rate resulting from the respective probe read which is above a threshold.

19. The computer program product of claim 16, wherein each of the at least one of the one or more other page groups include one or more pages which are positioned in a different layer and/or a different block of the non-volatile memory than the one or more pages included in the first page group, wherein the non-volatile memory is a three-dimensional NAND Flash memory.

20. The computer program product of claim 16, wherein the hierarchical page mapping is updated over time based on changes to a bit error rate correlation which exists between the pages in the non-volatile memory.

* * * * *